(12) United States Patent
Park

(10) Patent No.: US 10,692,431 B2
(45) Date of Patent: Jun. 23, 2020

(54) GATE DRIVER, DISPLAY APPARATUS HAVING THE SAME AND METHOD OF DRIVING DISPLAY PANEL USING THE SAME

(71) Applicant: SAMSUNG DISPLAY CO, LTD., Yongin-si, Gyeonggi-do (KR)

(72) Inventor: Suhyeong Park, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 16 days.

(21) Appl. No.: 16/214,881

(22) Filed: Dec. 10, 2018

(65) Prior Publication Data

US 2019/0287458 A1 Sep. 19, 2019

(30) Foreign Application Priority Data

Mar. 16, 2018 (KR) .................. 10-2018-0031134

(51) Int. Cl.
| | | |
|---|---|---|
| *G09G 3/3233* | (2016.01) | |
| *G09G 3/3258* | (2016.01) | |
| *G09G 3/3291* | (2016.01) | |
| *H01L 27/32* | (2006.01) | |
| *G09G 3/3266* | (2016.01) | |

(52) U.S. Cl.
CPC ......... *G09G 3/3233* (2013.01); *G09G 3/3258* (2013.01); *G09G 3/3266* (2013.01); *G09G 3/3291* (2013.01); *H01L 27/3276* (2013.01); *G09G 2310/08* (2013.01)

(58) Field of Classification Search
CPC ... G09G 2300/0819; G09G 2300/0842; G09G 2300/0861; G09G 2310/0262; G09G 2310/0286; G09G 2310/08; G09G 3/3233; G09G 3/3258; G09G 3/3266; G09G 3/3291; H01L 27/3276
See application file for complete search history.

(56) References Cited

U.S. PATENT DOCUMENTS

| | | | | |
|---|---|---|---|---|
| 2010/0141642 | A1* | 6/2010 | Furuta ................. | G11C 19/184 345/213 |
| 2015/0124005 | A1* | 5/2015 | Wang ................... | G09G 3/3233 345/690 |
| 2018/0122320 | A1* | 5/2018 | Sasaki ................... | G11C 19/28 |

FOREIGN PATENT DOCUMENTS

| | | |
|---|---|---|
| KR | 1020100053233 | 5/2010 |
| KR | 1020110035442 | 4/2011 |
| KR | 1020150052531 | 5/2015 |

\* cited by examiner

*Primary Examiner* — Dmitriy Bolotin
(74) *Attorney, Agent, or Firm* — F. Chau & Associates, LLC

(57) ABSTRACT

A gate driver includes a plurality of stages. A present stage among the plurality of stages is configured to receive a clock signal, a scan signal of a previous stage among the plurality of stages that is before the present stage, a first initialization voltage and a second initialization voltage different from the first initialization voltage and to generate a scan signal of the present stage and a initialization signal of the present stage based on the clock signal, the scan signal of the previous stage, the first initialization voltage and the second initialization voltage. The initialization signal of the present stage is varied between the first initialization voltage and the second initialization voltage according to time.

20 Claims, 16 Drawing Sheets

GATE DRIVER, DISPLAY APPARATUS HAVING THE SAME AND METHOD OF DRIVING DISPLAY PANEL USING THE SAME

CROSS-REFERENCE TO RELATED APPLICATIONS

This application claims priority under 35 U.S.C. § 119 to Korean Patent Application No. 10-2018-0031134, filed on Mar. 16, 2018 in the Korean Intellectual Property Office KIPO, the disclosure of which is incorporated by reference in its entirety herein.

BACKGROUND

1. Technical Field

Exemplary embodiments of the present inventive concept relate to a gate driver, a display apparatus including the gate driver and a method of driving a display panel using the display apparatus.

2. Discussion of Related Art

A display apparatus may include a display panel and a display panel driver. The display panel includes a plurality of gate lines, a plurality of data lines, a plurality of emission lines and a plurality of pixels. The display panel driver includes a gate driver, a data driver, an emission driver and a driving controller. The gate driver outputs gate signals to the gate lines. The data driver outputs data voltages to the data lines. The emission driver outputs emission signals to the emission lines. The driving controller controls the gate driver, the data driver and the emission driver.

An initialization voltage may be applied to a pixel of the display panel to initialize a data voltage node and an anode electrode of an organic light emitting diode. A level of the initialization voltage has to be low enough so that a black image is perceived. However, the level of the data voltage node may not be charged sufficiently during a data writing duration due to the low level of the initialization voltage.

SUMMARY

At least one exemplary embodiment of the present inventive concept provides a gate driver capable of enhancing a display quality of a display panel.

At least one exemplary embodiment of the present inventive concept provides a display apparatus including the gate driver.

At least one exemplary embodiment of the present inventive concept provides a method of driving the display panel using the display apparatus.

In an exemplary embodiment of the inventive concept, a gate driver is provided that includes a plurality of stages. A present stage among the plurality of stages is configured to receive a clock signal, a scan signal of a previous stage among the plurality of stages that is before the present stage, a first initialization voltage and a second initialization voltage different from the first initialization voltage and to generate a scan signal of a present stage and a initialization signal of the present stage based on the clock signal, the scan signal of the previous stage, the first initialization voltage and the second initialization voltage. The initialization signal of the present stage is varied between the first initialization voltage and the second initialization voltage according to time.

In an exemplary embodiment, the initialization signal may has the first initialization voltage when the scan signal of the previous stage has an active level, and the initialization signal has the second initialization voltage when the scan signal of the present stage has the active level.

In an exemplary embodiment, the present stage includes a first switching element including a control electrode to which a first clock signal is applied, an input electrode to which the scan signal of the previous stage is applied and an output electrode connected to a first control node, a second switching element including a control electrode connected to a second control node, an input electrode to which a first gate power voltage is applied and an output electrode connected to an input electrode of a third switching element, a third switching element including a control electrode to which a second clock signal is applied, the input electrode connected to the output electrode of the second switching element and an output electrode connected to the first control node, a fourth switching element including a control electrode connected to the first control node, an input electrode connected to the second control node and an output electrode connected to the first control node, a fifth switching element including a control electrode to which the first clock signal is applied, an input electrode to which a second gate power voltage different from the first gate power voltage is applied and an output electrode connected to the second control node, a sixth switching element including a control electrode connected to the second control node, an input electrode to which the first gate power voltage is applied and an output electrode connected to a first output node and a seventh switching element including a control electrode connected to the first control node, an input electrode to which the second clock signal is applied and an output electrode connected to the first output node.

In an exemplary embodiment, the present stage is configured to receive a control signal of the previous stage, the previous stage includes the same switching elements as the present stage, and the control signal of the previous stage is received from the second control node of the previous stage.

In an exemplary embodiment, the present stage furthers include an eighth switching element including a control electrode to which the scan signal of the previous stage is applied, an input electrode to which the first initialization voltage is applied and an output electrode connected to a second output node, a ninth switching element including a control electrode to which the second clock signal is applied, an input electrode to which the second initialization voltage is applied and an output electrode connected to the second output node and a tenth switching element including a control electrode to which a control signal of the previous stage is applied, an input electrode to which the second initialization voltage is applied and an output electrode connected to the second output node.

In an exemplary embodiment, the present stage further includes an eighth switching element including a control electrode to which the scan signal of the previous stage is applied, an input electrode to which the first initialization voltage is applied and an output electrode connected to a second output node and a ninth switching element including a control electrode to which a control signal of the previous stage is applied, an input electrode to which the second initialization voltage is applied and an output electrode connected to the second output node.

In an exemplary embodiment, the present stage furthers include an eighth switching element including a control electrode to which the scan signal of the previous stage is applied, an input electrode to which the first initialization voltage is applied and an output electrode connected to a second output node and a ninth switching element including a control electrode to which the second clock signal is applied, an input electrode to which the second initialization voltage is applied and an output electrode connected to the second output node.

In an exemplary embodiment, the second initialization voltage is equal to or less than a sum of a low power voltage applied to a cathode electrode of an organic light emitting diode of a pixel and a threshold voltage of the organic light emitting diode.

In an exemplary embodiment, the second initialization voltage is equal to the low power voltage.

In an exemplary embodiment of a display apparatus according to the present inventive concept, the display apparatus includes a display panel, a gate driver, a data driver and an emission driver. The display panel is configured to display an image. The gate driver includes a plurality of stages. A present stage among the plurality of the stages is configured to receive a clock signal, a scan signal of a previous stage of the plurality of stages that is before the present stage, a first initialization voltage and a second initialization voltage different from the first initialization voltage and to generate a scan signal of the present stage and an initialization signal of the present stage based on the clock signal, the scan signal of the previous stage, the first initialization voltage and the second initialization voltage. The gate driver is configured to output the scan signal of the present stage and the initialization signal of the present stage to the display panel. The data driver is configured to output a data voltage to the display panel. The emission driver is configured to output an emission signal to the display panel. The initialization signal of the present stage is varied between the first initialization voltage and the second initialization voltage according to time.

In an exemplary embodiment, the initialization signal has the first initialization voltage when the scan signal of the previous stage has an active level, and the initialization signal has the second initialization voltage when the scan signal of the present stage has an active level.

In an exemplary embodiment, the display panel includes a plurality of pixels, each of the pixels includes an organic light emitting diode, and the pixels are configured to receive a data write gate signal, a data initialization gate signal, an organic light emitting diode initialization gate signal, the data voltage and the emission signal and to emit light using the organic light emitting diode according to a level of the data voltage.

In an exemplary embodiment, at least one of the pixels includes a first pixel switching element including a control electrode connected to a first node, an input electrode connected to a second node and an output electrode connected to a third node, a second pixel switching element including a control electrode to which the data write gate signal is applied, an input electrode to which the data voltage is applied and an output electrode connected to the second node, a third pixel switching element including a control electrode to which the data write gate signal is applied, an input electrode connected to the first node and an output electrode connected to the third node, a fourth pixel switching element including a control electrode to which the data initialization gate signal is applied, an input electrode to which the initialization signal of the present stage is applied and an output electrode connected to the first node, a fifth pixel switching element including a control electrode to which the emission signal is applied, an input electrode to which a high power voltage is applied and an output electrode connected to the second node, a sixth pixel switching element including a control electrode to which the emission signal is applied, an input electrode connected to the third node and an output electrode connected to an anode electrode of the organic light emitting diode, a seventh pixel switching element including a control electrode to which the organic light emitting diode initialization gate signal is applied, an input electrode to which the initialization signal of the present stage is applied and an output electrode connected to the anode electrode of the organic light emitting diode, a storage capacitor including a first electrode to which the high power voltage is applied and a second electrode connected to the first node and the organic light emitting diode including the anode electrode and a cathode electrode to which a low power voltage is applied.

In an exemplary embodiment, the data initialization gate signal of the present stage is the scan signal of the previous stage, the data write gate signal of the present stage is the scan signal of the present stage, and the organic light emitting diode initialization gate signal of the present stage is a scan signal of a next stage among the plurality stages that is after the present stage.

In an exemplary embodiment, the data initialization gate signal of the present stage is the scan signal of the previous stage, the data write gate signal of the present stage is the scan signal of the present stage, and the organic light emitting diode initialization gate signal of the present stage is the scan signal of the present stage.

In an exemplary embodiment of the inventive concept, a method of driving a display panel is provided. The method includes outputting a scan signal of a present stage among a plurality of stages of a gate driver and an initialization signal of the present stage to the display panel based on a clock signal, a scan signal of a previous stage of the plurality of stages that is before the present stage, a first initialization voltage and a second initialization voltage different from the first initialization voltage; outputting a data voltage to the display panel and outputting an emission signal to the display panel. The initialization signal of the present stage is varied between the first initialization voltage and the second initialization voltage according to time.

In an exemplary embodiment, the initialization signal has the first initialization voltage when the scan signal of the previous stage has an active level, and the initialization signal has the second initialization voltage when the scan signal of the present stage has the active level.

In an exemplary embodiment, the display panel includes a plurality of pixels, each of the pixels includes an organic light emitting diode, and the pixels are configured to receive a data write gate signal, a data initialization gate signal, an organic light emitting diode initialization gate signal, the data voltage and the emission signal and to emit light using the organic light emitting diode according to a level of the data voltage.

In an exemplary embodiment, the data initialization gate signal of the present stage is the scan signal of the previous stage, the data write gate signal of the present stage is the scan signal of the present stage, and the organic light emitting diode initialization gate signal of the present stage is a scan signal of a next stage among the plurality of stages that is after the present stage.

In an exemplary embodiment, the data initialization gate signal of the present stage is the scan signal of the previous stage, the data write gate signal of the present stage is the scan signal of the present stage, and the organic light emitting diode initialization gate signal of the present stage is the scan signal of the present stage.

In an exemplary embodiment of the inventive concept, a gate driver is provided that includes a plurality of stages. A present stage among the plurality of stages is configured to receive a clock signal, a vertical start signal, a first initialization voltage and a second initialization voltage different from the first initialization voltage and to generate a scan signal of a present stage and a initialization signal of the present stage based on the clock signal, the vertical start signal, the first initialization voltage and the second initialization voltage. The initialization signal of the present stage is varied between the first initialization voltage and the second initialization voltage according to time.

In an embodiment, a next stage among the stages after the present stage is configured to receive the clock signal, the scan signal of the present stage, and the first and second initialization voltages to generate a scan signal of the next stage.

In an embodiment, the initialization signal has the first initialization voltage when the vertical start signal has an active level, and the initialization signal has the second initialization voltage when the scan signal of the present stage has the active level.

BRIEF DESCRIPTION OF THE DRAWINGS

The present inventive concept will become more apparent by describing in detailed exemplary embodiments thereof with reference to the accompanying drawings, in which.

DETAILED DESCRIPTION OF EMBODIMENTS OF THE INVENTIVE CONCEPT

Hereinafter, exemplary embodiments of the present inventive concept will be explained in detail with reference to the accompanying drawings.

Figure 1:
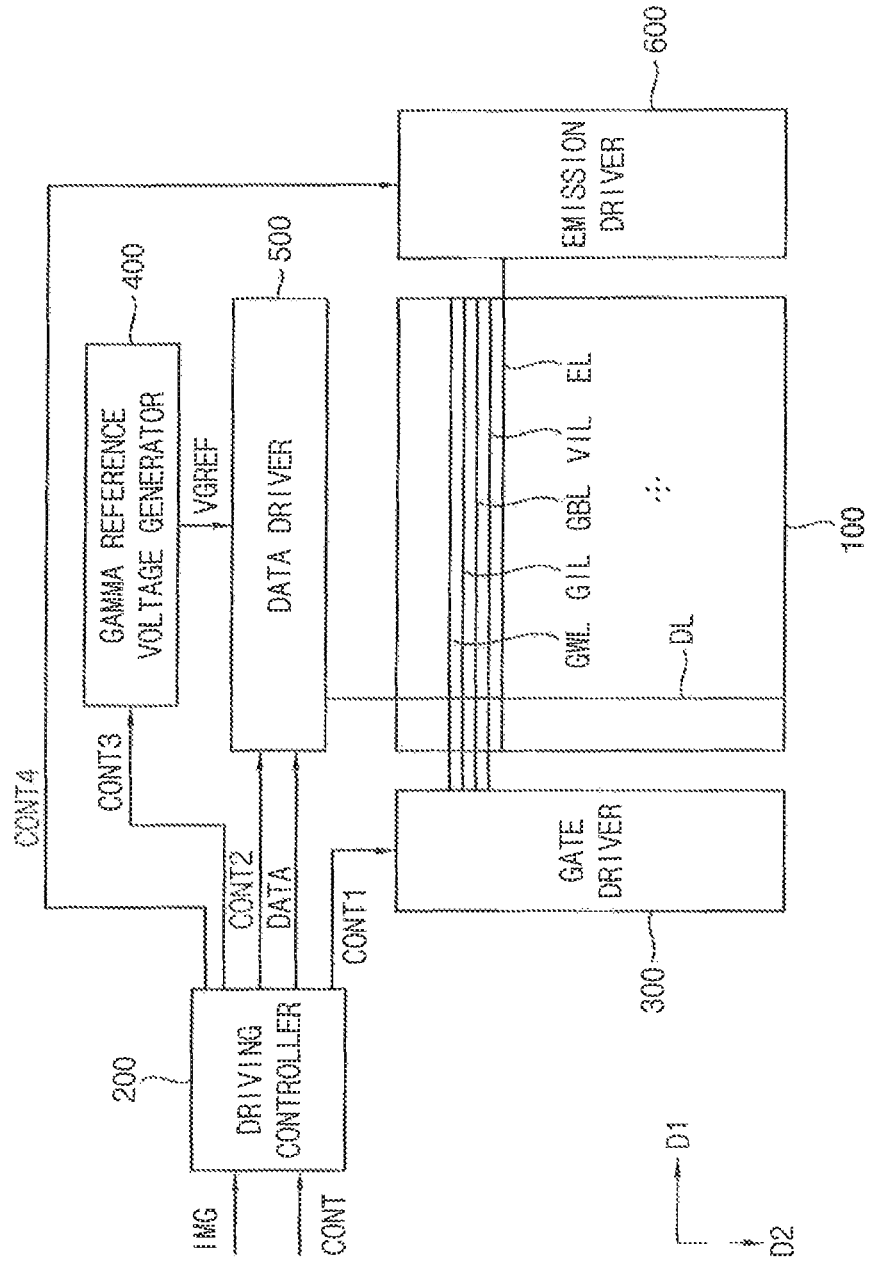
FIG. 1 is a block diagram illustrating a display apparatus according to an exemplary embodiment of the present inventive concept.

FIG. 1 is a block diagram illustrating a display apparatus according to an exemplary embodiment of the present inventive concept.

Referring to FIG. 1, the display apparatus includes a display panel 100 and a display panel driver (e.g., a driving circuit). The display panel driver includes a driving controller 200 (e.g., a control circuit), a gate driver 300 (e.g., a driving circuit), a gamma reference voltage generator 400, a data driver 500 (e.g., a driving circuit) and an emission driver 600 (e.g., a driving circuit).

The display panel 100 has a display region on which an image is displayed and a peripheral region adjacent to the display region. For example, the peripheral region may surround the display region.

The display panel 100 includes a plurality of gate lines GWL, GIL and GBL, a plurality of data lines DL, a plurality of emission lines EL and a plurality of pixels electrically connected to the gate lines GWL, GIL and GBL, the data lines DL and the emission lines EL. The gate lines GWL, GIL and GBL extend in a first direction D1, the data lines DL extend in a second direction D2 crossing the first direction D1 and the emission lines EL extend in the first direction D1.

In the present exemplary embodiment, the display panel 100 further includes a plurality of initialization lines VIL for transmitting an initialization signal to one or more of the pixels. The initialization lines VIL may extend in the first direction D1.

The driving controller 200 receives input image data IMG and an input control signal CONT from an external apparatus (not shown). For example, the input image data IMG may include red image data, green image data and blue image data. The input image data IMG may include white image data. The input image data IMG may include magenta image data, cyan image data and yellow image data. The input control signal CONT may include a master clock signal and a data enable signal. The data enable signal may indicate when to display data on the display panel 100. The input control signal CONT may further include a vertical synchronizing signal and a horizontal synchronizing signal. The vertical synchronizing signal may indicate the start of a frame, and the horizontal synchronizing signal may indicate the start of a line of the frame.

The driving controller 200 generates a first control signal CONT1, a second control signal CONT2, a third control signal CONT3, a fourth control signal CONT4 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal. In an embodiment, the vertical start signal is a signal indicating when to select the gate lines of the display panel 100. For example, the gate driver 300 may drive the gate lines sequentially when the vertical start signal is changed from one logic level to a second other logic level.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The driving controller 200 generates the fourth control signal CONT4 for controlling an operation of the emission driver 600 based on the input control signal CONT, and outputs the fourth control signal CONT4 to the emission driver 600.

The gate driver 300 generates gate signals driving the gate lines GWL, GIL and GBL in response to the first control signal CONT1 received from the driving controller 200. The gate driver 300 may sequentially output the gate signals to the gate lines GWL, GIL and GBL.

In the present exemplary embodiment, the gate driver 300 generates an initialization signal to drive the initialization lines VIL in response to the first control signal CONT1 received from the driving controller 200. The gate driver 300 outputs the initialization signals to the initialization lines VIL.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an exemplary embodiment, the gamma reference voltage generator 400 is disposed in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

The emission driver 600 generates emission signals to drive the emission lines EL in response to the fourth control signal CONT4 received from the driving controller 200. The emission driver 600 outputs the emission signals to the emission lines EL.

Figure 2:
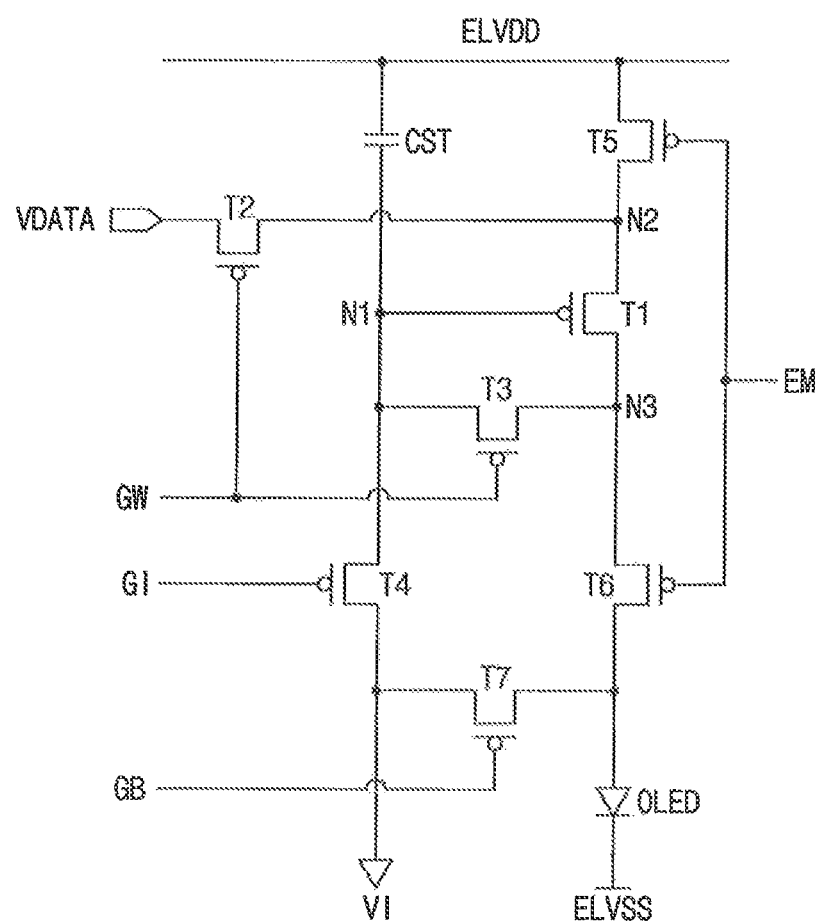
FIG. 2 is a circuit diagram illustrating a pixel of a display panel of FIG. 1.
Figure 3:
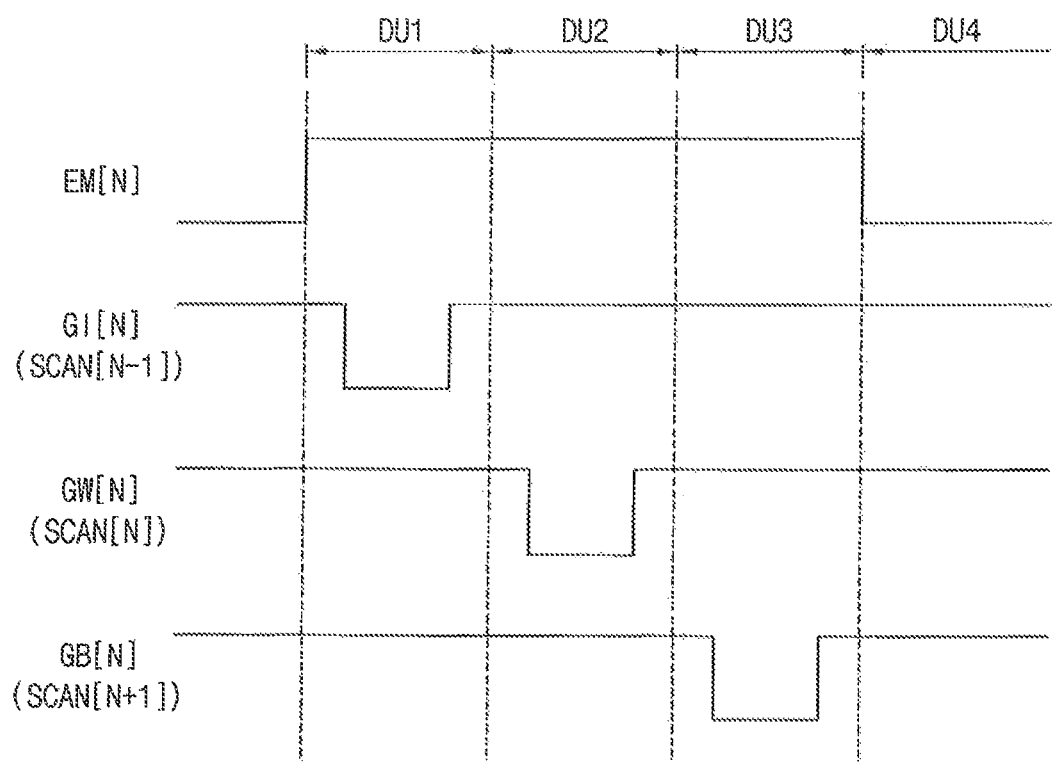
FIG. 3 is a timing diagram illustrating input signals applied to the pixel of FIG. 2.

FIG. 2 is a circuit diagram illustrating a pixel of the display panel 100 of FIG. 1 according to an exemplary embodiment of the inventive concept. FIG. 3 is a timing diagram illustrating input signals applied to the pixel of FIG. 2 according to an exemplary embodiment of the inventive concept.

Referring to FIGS. 1 to 3, the display panel 100 includes the plurality of the pixels. Each pixel includes an organic light emitting diode OLED.

In an embodiment, at least one of the pixels receives a data write gate signal GW, a data initialization gate signal GI, an organic light emitting diode initialization signal GB, the data voltage VDATA and the emission signal EM and the organic light emitting diode OLED of the pixel emits light corresponding to the level of the data voltage VDATA to display an image.

In an embodiment, at least one of the pixels includes first to seventh pixel switching elements T1 to T7, a storage capacitor CST and the organic light emitting diode OLED.

The first pixel switching element T1 includes a control electrode connected to a first node N1, an input electrode connected to a second node N2 and an output electrode connected to a third node N3.

For example, the first pixel switching element T1 may be a P-type thin film transistor. The control electrode of the first pixel switching element T1 may be a gate electrode, the input electrode of the first pixel switching element T1 may be a source electrode and the output electrode of the first pixel switching element T1 may be a drain electrode.

The second pixel switching element T2 includes a control electrode to which the data write gate signal GW is applied, an input electrode to which the data voltage VDATA is applied and an output electrode connected to the second node N2.

For example, the second pixel switching element T2 may be a P-type thin film transistor. The control electrode of the second pixel switching element T2 may be a gate electrode, the input electrode of the second pixel switching element T2 may be a source electrode and the output electrode of the second pixel switching element T2 may be a drain electrode.

The third pixel switching element T3 includes a control electrode to which the data write gate signal GW is applied, an input electrode connected to the first node N1 and an output electrode connected to the third node N3.

For example, the third pixel switching element T3 may be a P-type thin film transistor. The control electrode of the third pixel switching element T3 may be a gate electrode, the input electrode of the third pixel switching element T3 may be a source electrode and the output electrode of the third pixel switching element T3 may be a drain electrode.

The fourth pixel switching element T4 includes a control electrode to which the data initialization gate signal GI is applied, an input electrode to which the initialization signal VI is applied and an output electrode connected to the first node N1.

For example, the fourth pixel switching element T4 may be a P-type thin film transistor. The control electrode of the fourth pixel switching element T4 may be a gate electrode, the input electrode of the fourth pixel switching element T4 may be a source electrode and the output electrode of the fourth pixel switching element T4 may be a drain electrode.

The fifth pixel switching element T5 includes a control electrode to which the emission signal EM is applied, an input electrode to which a high power voltage ELVDD is applied and an output electrode connected to the second node N2.

For example, the fifth pixel switching element T5 may be a P-type thin film transistor. The control electrode of the fifth pixel switching element T5 may be a gate electrode, the input electrode of the fifth pixel switching element T5 may be a source electrode and the output electrode of the fifth pixel switching element T5 may be a drain electrode.

The sixth pixel switching element T6 includes a control electrode to which the emission signal EM is applied, an input electrode connected to the third node N3 and an output electrode connected to an anode electrode of the organic light emitting diode OLED.

For example, the sixth pixel switching element T6 may be a P-type thin film transistor. The control electrode of the sixth pixel switching element T6 may be a gate electrode, the input electrode of the sixth pixel switching element T6 may be a source electrode and the output electrode of the sixth pixel switching element T6 may be a drain electrode.

The seventh pixel switching element T7 includes a control electrode to which the organic light emitting diode initialization gate signal GB is applied, an input electrode to which the initialization signal VI is applied and an output electrode connected to the anode electrode of the organic light emitting diode OLED.

For example, the seventh pixel switching element T7 may be a P-type thin film transistor. The control electrode of the seventh pixel switching element T7 may be a gate electrode, the input electrode of the seventh pixel switching element T7 may be a source electrode and the output electrode of the seventh pixel switching element T7 may be a drain electrode.

The storage capacitor CST includes a first electrode to which a high power voltage ELVDD is applied and a second electrode connected to the first node N1.

The organic light emitting diode OLED includes the anode electrode and a cathode electrode to which a low power voltage ELVSS is applied.

In FIG. 3, during a first duration DU1, the first node N1 and the storage capacitor CST are initialized in response to the data initialization gate signal GI. During a second duration DU2, a threshold voltage |VTH| of the first pixel switching element T1 is compensated and the data voltage VDATA of which the threshold voltage |VTH| is compensated is written to the first node N1 in response to the data write gate signal GW. During a third duration DU3, the anode electrode of the organic light emitting diode OLED is initialized in response to the organic light emitting diode initialization gate signal GB. During a fourth duration DU4, the organic light emitting diode OLED emits light in response to the emission signal EM so that the display panel 100 displays the image.

During the first duration DU1, the data initialization gate signal GI has an active level. In an embodiment, the data initialization gate signal GI has the active level for only part of the first duration DU1. For example, the active level of the data initialization gate signal GI may be a low level. When the data initialization gate signal GI has the active level, the fourth pixel switching element T4 is turned on so that the initialization signal VI is applied to the first node N1. In an embodiment, the data initialization gate signal GI[N] of a present stage is a scan signal SCAN[N−1] of a previous stage. In an embodiment, the gate driver 300 includes a plurality of stages, where each stage provides a scan signal to a corresponding one of the gate lines. For example, the first stage may provide a scan signal to a first gate line and to the second stage so the second stage can use the provided scan signal as its data initialization signal GI.

During the second duration DU2, the data write gate signal GW has an active level. In an embodiment, the data write gate signal GW has the active level for only part of the second duration DU2. For example, the active level of the data write gate signal GW may be a low level. When the data write gate signal GW has the active level, the second pixel switching element T2 and the third pixel switching element T3 are turned on. In addition, the first pixel switching element T1 is turned on in response to the initialization signal VI. In an embodiment, the data write gate signal GW[N] of the present stage is a scan signal SCAN[N] of the present stage. For example, the first stage of the gate driver 300 may provide a scan signal to the first gate line and use the scan signal as its write gate signal GW.

A voltage generated by subtracting an absolute value |VTH| of the threshold voltage of the first pixel switching element T1 from the data voltage VDATA may be charged at the first node N1 along a path generated by the first to third pixel switching elements T1, T2 and T3.

During the third duration DU3, the organic light emitting diode initialization signal GB has an active level. In an embodiment, the light emitting diode initialization signal GB has the active level for only part of the third duration DU2. For example, the active level of the organic light emitting diode initialization signal GB may be a low level. When the organic light emitting diode initialization signal GB has the active level, the seventh pixel switching element T7 is turned on so that the initialization signal VI is applied to the anode electrode of the organic light emitting diode OLED. In an embodiment, the organic light emitting diode initialization signal GB[N] of a present stage is a scan signal SCAN[N+1] of a next stage. For example, the second stage of the gate driver 300 may provide a scan signal to a second gate line and to the first stage so the first stage can use the provided scan signal as its organic light emitting diode initialization signal GB.

During the fourth duration DU4, the emission signal EM has an active level. The active level of the emission signal EM may be a low level. When the emission signal EM has the active level, the fifth pixel switching element T5 and the sixth pixel switching element T6 are turned on. In addition, the first pixel switching element T1 is turned on by the data voltage VDATA.

In an exemplary embodiment, each of durations DU1, DU2, and DU3 have a same length (i.e., duration). In another exemplary embodiment, each of the durations DU1, DU2, DU3, and DU4 have a same duration.

A driving current flows through the fifth pixel switching element T5, the first pixel switching element T1 and the sixth pixel switching element T6 to drive the organic light emitting diode OLED. The driving current may flow through the fifth pixel switching element T5 during the fourth duration DU4. An intensity of the driving current may be determined by the level of the data voltage VDATA. A luminance of the organic light emitting diode OLED is determined by the intensity of the driving current. The driving current ISD flowing through a path from the input electrode to the output electrode of the first pixel switching element T1 is determined by the following Equation 1.

$$ISD = \frac{1}{2}\mu Cox \frac{W}{L}(VSG - |VTH|)^2 \qquad \text{[Equation 1]}$$

In Equation 1, μ is a mobility of the first pixel switching element T1. Cox is a capacitance per unit area of the first pixel switching element T1. W/L is a width to length ratio of the first pixel switching element T1. VSG is a voltage between the input electrode N2 of the first pixel switching element T1 and the control node N1 of the first pixel switching element T1. |VTH| is the threshold voltage of the first pixel switching element T1.

The voltage VG of the first node N1 after the compensation of the threshold voltage |VTH| during the second duration DU2 may be represented by the following Equation 2.

$$VG = VDATA - |VTH| \quad \text{[Equation 2]}$$

When the organic light emitting diode OLED emits the light during the fourth duration DU4, the driving voltage VOV and the driving current ISD may be represented by the following Equations 3 and 4, respectively. In Equation 3, VS is a voltage of the second node N2.

$$VOV = VS - VG - |VTH| = \\ ELVDD - (VDATA - |VTH|) - |VTH| = ELVDD - VDATA \quad \text{[Equation 3]}$$

$$ISD = \frac{1}{2}\mu Cox \frac{W}{L}(ELVDD - VDATA)^2 \quad \text{[Equation 4]}$$

The threshold voltage |VTH| is compensated during the second duration DU2, so that the driving current ISD is determined regardless of the threshold voltage |VTH| of the first pixel switching element T1 when the organic light emitting diode OLED emits the light during the fourth duration DU4.

Figure 4:
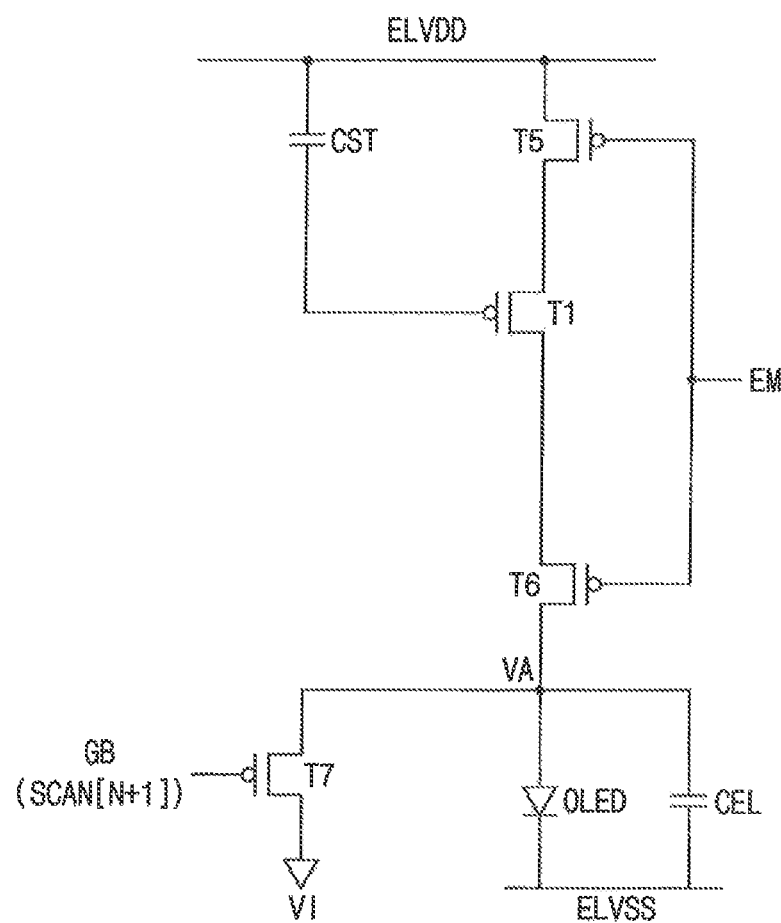
FIG. 4 is a circuit diagram illustrating a part of the pixel of FIG. 2.
Figure 5:
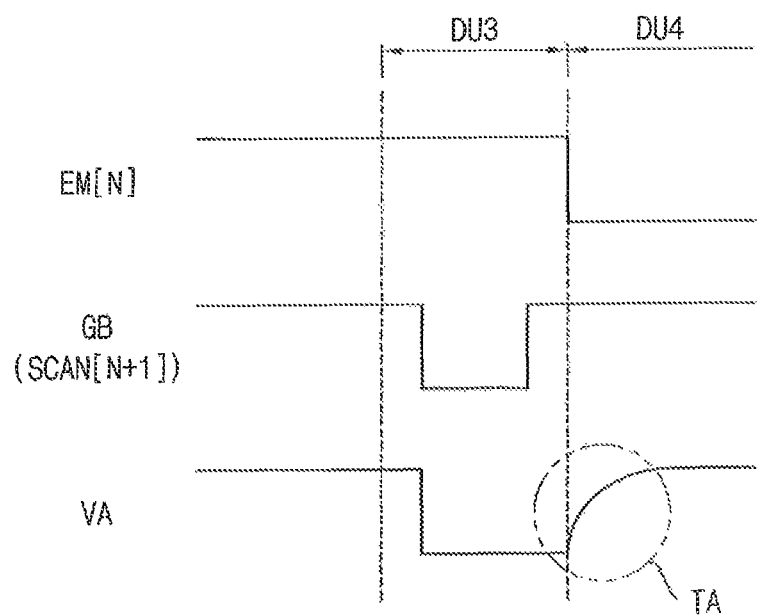
FIG. 5 is a timing diagram illustrating a voltage of an anode electrode of an organic light emitting diode of FIG. 4.

FIG. 4 is a circuit diagram illustrating a part of the pixel of FIG. 2 according to an exemplary embodiment of the inventive concept. FIG. 5 is a timing diagram illustrating a voltage of an anode electrode of the organic light emitting diode OLED of FIG. 4.

Referring to FIGS. 4 and 5, during the third duration DU3 when the organic light emitting diode initialization gate signal GB has the active level, the initialization signal VI is applied to the anode electrode of the organic light emitting diode OLED. Hereinafter, the voltage of the anode electrode of the organic light emitting diode OLED may be referred to as VA.

Prior to the initialization of the organic light emitting diode OLED, the voltage VA of the anode electrode may have a level of ELVSS+VEL from the data voltage VDATA of a previous frame. Herein, VEL is a threshold voltage of the organic light emitting diode OLED. CEL in FIG. 4 is a parallel capacitance of the organic light emitting diode OLED.

During the initialization duration DU3 of the organic light emitting diode OLED, the voltage VA of the anode electrode of the organic light emitting diode OLED may have a level of the initialization signal VI.

During the emitting duration DU4 of the organic light emitting diode OLED, the voltage VA of the anode electrode of the organic light emitting diode OLED gradually increases (e.g., see TA in FIG. 5).

When the level of the initialization signal VI is quite low, the organic light emitting diode OLED is not turned on by a leakage current during the initialization duration DU3 of the organic light emitting diode OLED. Thus, the initialization of the organic light emitting diode OLED may be referred to as black image enhancement.

In an exemplary embodiment, during the initialization duration DU3 of the organic light emitting diode OLED, the level of the initialization signal VI is equal to or less than a sum of the low power voltage ELVSS applied to the cathode electrode of the organic light emitting diode OLED and the threshold voltage VEL of the organic light emitting diode OLED.

For example, during the initialization duration DU3 of the organic light emitting diode OLED, the level of the initialization signal VI may be equal to the low power voltage ELVSS applied to the cathode electrode of the organic light emitting diode OLED.

In contrast, when the level of the initialization signal VI is excessively low, the charging rate of the voltage (VG=VDATA-|VTH|) written to the first node N1 during the data writing duration DU2 may not be enough to sufficiently compensate the threshold voltage |VTH| of the first pixel switching element T1.

Particularly, when the level of the low power voltage ELVSS is decreased for a high luminance emission, the level of the initialization signal VI in the third duration DU3 may be decreased. Thus, when the level of the initialization signal VI is applied during the first duration DU1, lack of the charging rate of the data voltage VDATA in the second duration DU2 and error of compensating the threshold voltage of the voltage VG of the first node N1 may get worse. The lack of the charging rate of the data voltage VDATA in the second duration DU2 and the error of compensating the threshold voltage of the voltage VG of the first node N1 may cause a stain to be perceivable on the display panel 100.

Figure 6:
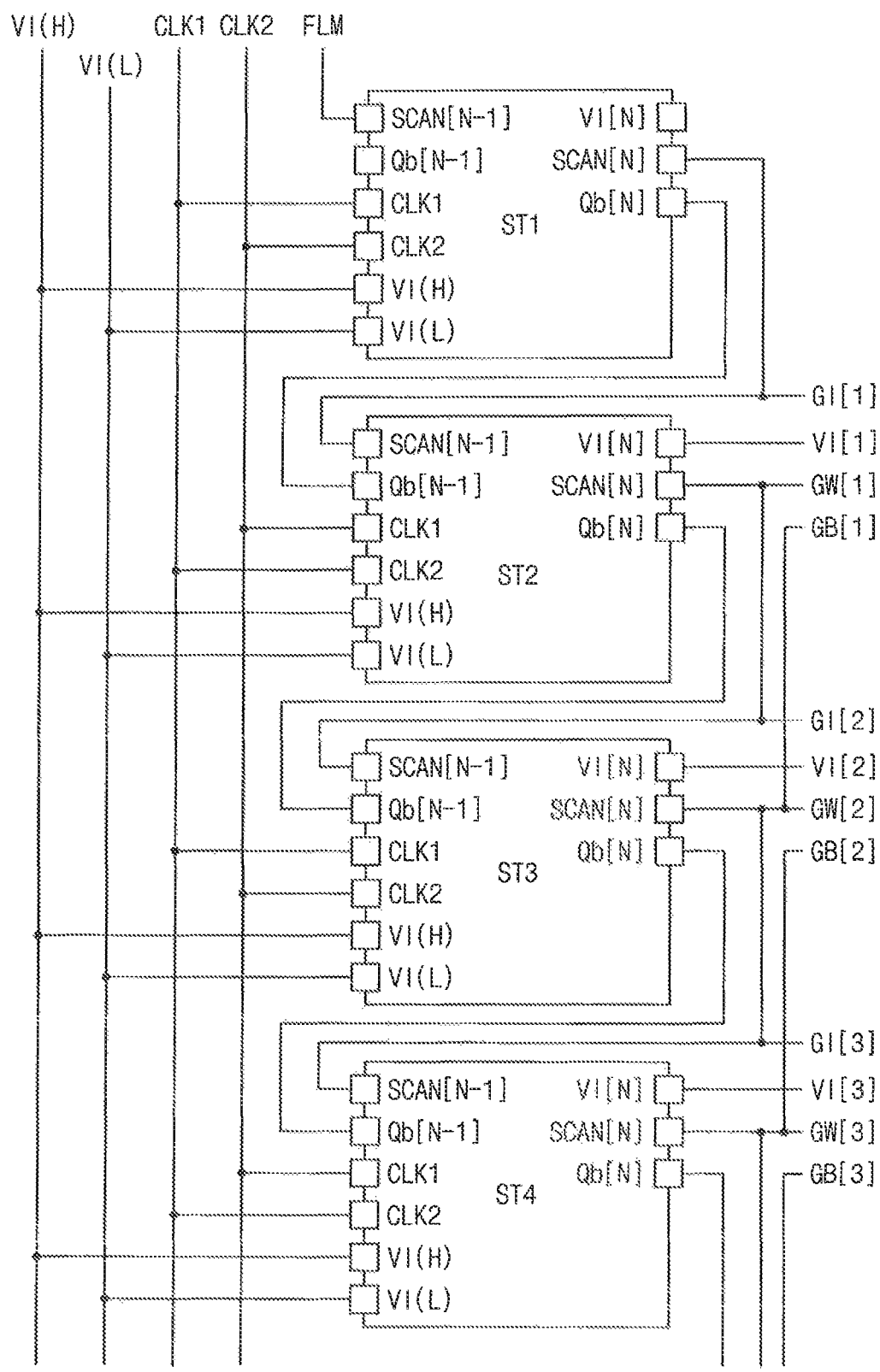
FIG. 6 is a block diagram illustrating a plurality of stages of a gate driver of FIG. 1 according to an exemplary embodiment of the inventive concept.

FIG. 6 is a block diagram illustrating a plurality of stages of the gate driver 300 of FIG. 1 according to an exemplary embodiment of the inventive concept.

Referring to FIGS. 1 to 6, the gate driver 300 includes the plurality of stages (e.g. ST1 to ST4). Although four stages ST1 to ST4 are illustrated in FIG. 6 for convenience of explanation, the present inventive concept is not limited thereto. For example, the gate driver 300 may include stages equal to or greater than the number of pixel rows of the display panel 100.

At least one of the stages ST1 to ST4 generates the scan signal SCAN[N] of the present stage and the initialization signal VI[N] of the present stage that varies between a first initialization voltage VI(H) and a second initialization voltage VI(L) different from the first initialization voltage VI(H) according to time based on a clock signal (e.g. CLK1 and CLK2), a scan signal SCAN[N−1] of the previous stage, the first initialization voltage VI(H) and the second initialization voltage VI(L).

A first stage ST1 may receive a vertical start signal FLM instead of the scan signal of the previous stage. The first stage ST1 may receive the vertical start signal FLM when there is no prior stage.

The present stage may further receive a control signal (e.g. Qb[N−1]) of the previous stage.

The stages ST1 to ST4 may receive a first clock signal CLK1 and a second clock signal CLK2. For example, the first clock signal CLK1 is applied to a first clock terminal of the first stage ST1 and the second clock signal CLK2 is applied to a second clock terminal of the first stage ST1. In contrast, the second clock signal CLK2 is applied to a first clock terminal of the second stage ST2 and the first clock signal CLK1 is applied to a second clock terminal of the second stage ST2. In contrast, the first clock signal CLK1 is applied to a first clock terminal of the third stage ST3 and the second clock signal CLK2 is applied to a second clock terminal of the third stage ST3. In contrast, the second clock signal CLK2 is applied to a first clock terminal of the fourth stage ST4 and the first clock signal CLK1 is applied to a second clock terminal of the fourth stage ST4. In an embodiment, the first clock signal CLK1 includes low pulses during odd driving durations and the second clock signal CLK2 includes low pulses during even driving durations, among a plurality of consecutive driving durations.

In an exemplary embodiment, the scan signal of the first stage ST1 (e.g., the scan signal output by the first stage ST1) is the data initialization gate signal GI[1] of the second stage ST2, the scan signal of the second stage ST2 (e.g., the scan signal output by the second stage ST2) is the data write gate signal GW[1] of the second stage ST2 and the scan signal of the third stage ST3 (e.g., the scan signal output by the third stage ST3) is the organic light emitting diode initialization gate signal GB[1] of the second stage ST2.

In an exemplary embodiment, the scan signal of the second stage ST2 is the data initialization gate signal GI[2] of the third stage ST3, the scan signal of the third stage ST3 is the data write gate signal GW[2] of the third stage ST3 and the scan signal of the fourth stage ST4 is the organic light emitting diode initialization gate signal GB[2] of the third stage ST3.

In an exemplary embodiment, the scan signal of the third stage ST3 is the data initialization gate signal GI[3] of the fourth stage ST4, the scan signal of the fourth stage ST4 is the data write gate signal GW[3] of the fourth stage ST4 and a scan signal of a fifth stage is the organic light emitting diode initialization gate signal GB[3] of the fourth stage ST4.

Figure 7:
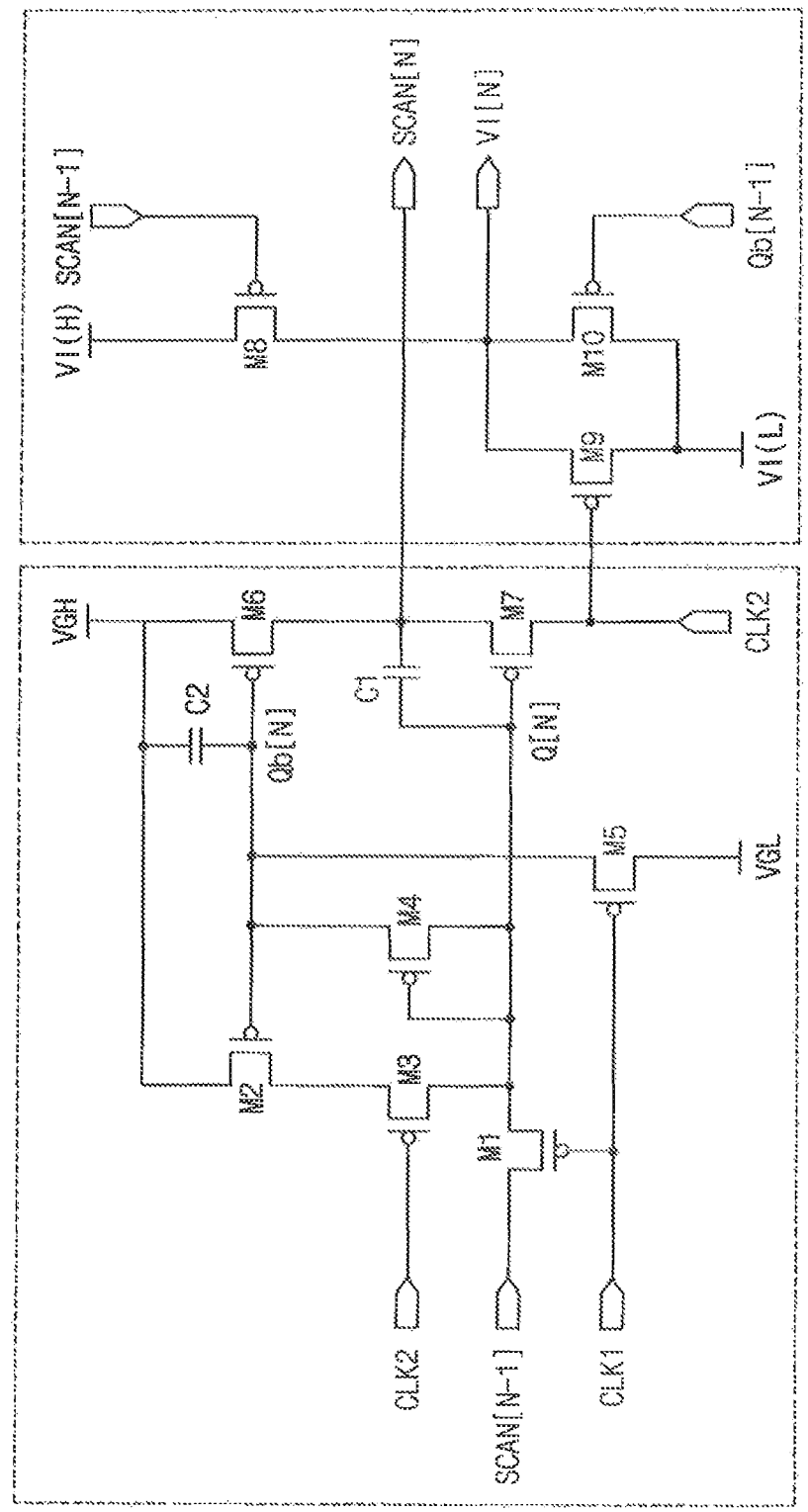
FIG. 7 is a circuit diagram illustrating the stage of FIG. 6 according to an exemplary embodiment of the inventive concept.
Figure 8:
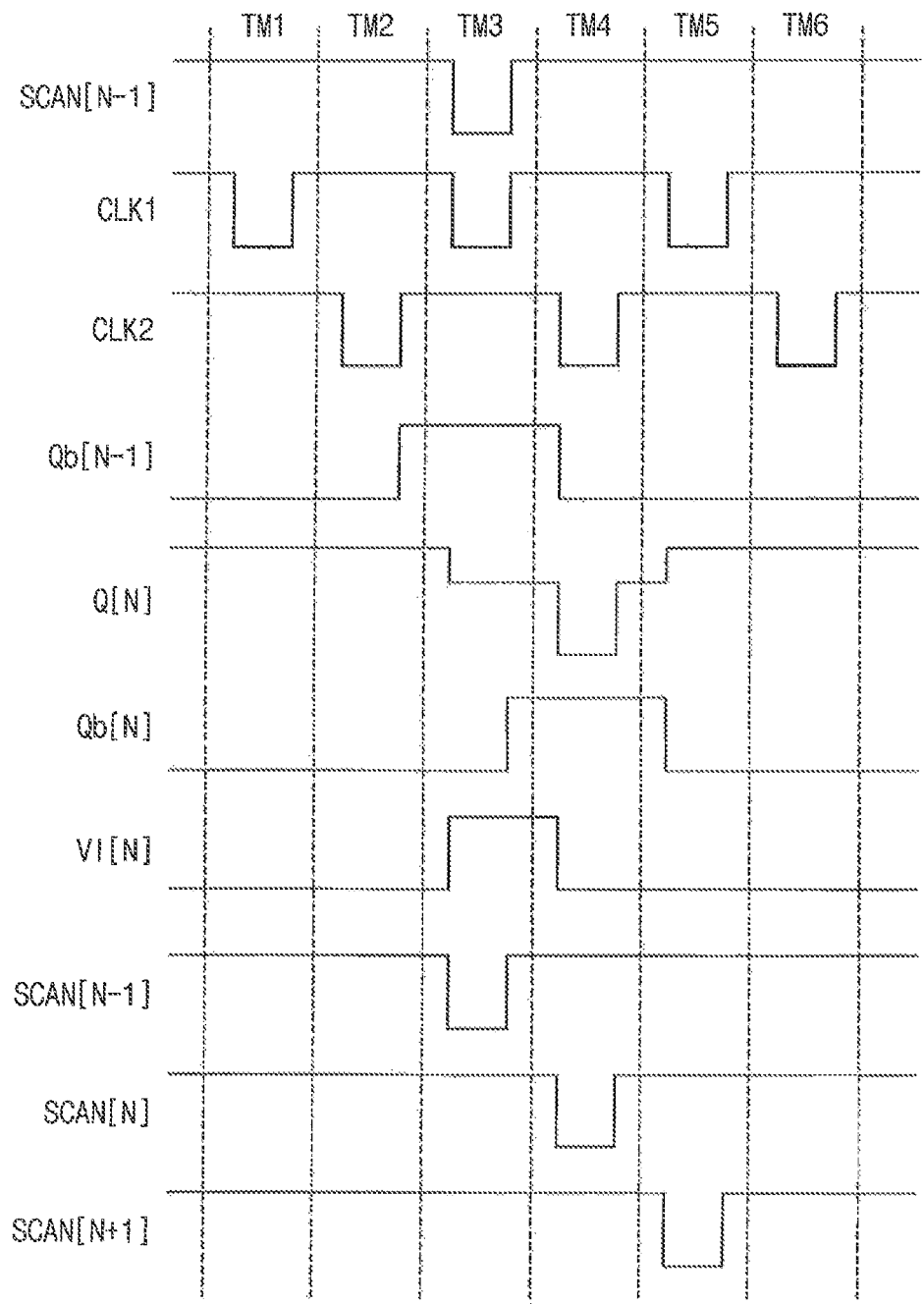
FIG. 8 is a timing diagram illustrating input signals, output signals and control signals of the stage of FIG. 7.

FIG. 7 is a circuit diagram illustrating a stage of FIG. 6 according to an exemplary embodiment of the inventive concept. FIG. 8 is a timing diagram illustrating input signals, output signals and control signals of the stage of FIG. 7.

Referring to FIGS. 1 to 8, at least one of the stages includes first to seven switching elements M1 to M7, a first capacitor C1 and a second capacitor C2.

The first switching element M1 includes a control electrode to which the first clock signal CLK1 is applied, an input electrode to which the scan signal SCAN[N−1] of the previous stage (e.g., the scan signal output by the previous stage) is applied and an output electrode connected to a first control node Q[N].

For example, the first switching element M1 may be a P-type thin film transistor. The control electrode of the first switching element M1 may be a gate electrode, the input electrode of the first switching element M1 may be a source electrode and the output electrode of the first switching element M1 may be a drain electrode.

The second switching element M2 includes a control electrode connected to a second control node Qb[N], an input electrode to which a first gate power voltage VGH is applied and an output electrode connected to an input electrode of the third switching element M3.

For example, the second switching element M2 may be a P-type thin film transistor. The control electrode of the second switching element M2 may be a gate electrode, the input electrode of the second switching element M2 may be a source electrode and the output electrode of the second switching element M2 may be a drain electrode.

The third switching element M3 includes a control electrode to which the second clock signal CLK2 is applied, an input electrode connected to the output electrode of the second switching element M2 and an output electrode connected to the first control node Q[N].

For example, the third switching element M3 may be a P-type thin film transistor. The control electrode of the third switching element M3 may be a gate electrode, the input electrode of the third switching element M3 may be a source electrode and the output electrode of the third switching element M3 may be a drain electrode.

The fourth switching element M4 includes a control electrode connected to the first control node Q[N], an input electrode connected to the second control node Qb[N] and an output electrode connected to the first control node Q[N].

For example, the fourth switching element M4 may be a P-type thin film transistor. The control electrode of the fourth switching element M4 may be a gate electrode, the input electrode of the fourth switching element M4 may be a source electrode and the output electrode of the fourth switching element M4 may be a drain electrode.

The fifth switching element M5 includes a control electrode to which the first clock signal CLK1 is applied, an input electrode to which a second gate power voltage VGL different from the first gate power voltage VGH is applied and an output electrode connected to the second control node Qb[N].

For example, the fifth switching element M5 may be a P-type thin film transistor.

The control electrode of the fifth switching element M5 may be a gate electrode, the input electrode of the fifth switching element M5 may be a source electrode and the output electrode of the fifth switching element M5 may be a drain electrode.

The sixth switching element M6 includes a control electrode connected to the second control node Qb[N], an input electrode to which the first gate power voltage VGH is applied and an output electrode connected to a first output node SCAN[N]. The first output node SCAN[N] may be a node outputting the scan signal of the present stage.

For example, the sixth switching element M6 may be a P-type thin film transistor. The control electrode of the sixth switching element M6 may be a gate electrode, the input electrode of the sixth switching element M6 may be a source electrode and the output electrode of the sixth switching element M6 may be a drain electrode.

The seventh switching element M7 includes a control electrode connected to the first control node Q[N], an input electrode to which the second clock signal CLK2 is applied and an output electrode connected to the first output node SCAN[N].

For example, the seventh switching element M7 may be a P-type thin film transistor. The control electrode of the seventh switching element M7 may be a gate electrode, the input electrode of the seventh switching element M7 may be a source electrode and the output electrode of the seventh switching element M7 may be a drain electrode.

The first capacitor C1 includes a first electrode connected to the first output node SCAN[N] and a second electrode connected to the first control node Q[N].

The second capacitor C2 includes a first electrode to which the first gate power voltage VGH is applied and a second electrode connected to the second control node Qb[N].

In a present exemplary embodiment of the inventive concept, at least one of the stages further includes an eighth switching element M8, a ninth switching element M9 and a tenth switching element M10.

The eighth switching element M8 includes a control electrode to which the scan signal SCAN[N−1] of the previous stage (e.g., the scan signal output by the previous stage) is applied, an input electrode to which the first initialization voltage VI(H) is applied and an output electrode connected to a second output node VI[N]. In an exemplary embodiment, when there is no previous stage, the control electrode of the eighth switching element M8 receives a vertical start signal. The second output node VI[N] may be a node outputting the initialization signal VI of the present stage.

For example, the eighth switching element M8 may be a P-type thin film transistor. The control electrode of the eighth switching element M8 may be a gate electrode, the input electrode of the eighth switching element M8 may be a source electrode and the output electrode of the eighth switching element M8 may be a drain electrode.

The ninth switching element M9 includes a control electrode to which the second clock signal CLK2 is applied, an input electrode to which the second initialization voltage VI(L) is applied and an output electrode connected to the second output node VI[N].

For example, the ninth switching element M9 may be a P-type thin film transistor. The control electrode of the ninth switching element M9 may be a gate electrode, the input electrode of the ninth switching element M9 may be a source electrode and the output electrode of the ninth switching element M9 may be a drain electrode.

The tenth switching element M10 includes a control electrode to which the control signal Qb[N-1] of the previous stage is applied, an input electrode to which the second initialization voltage VI(L) is applied and an output electrode connected to the second output node VI[N].

In an embodiment, the control signal of the previous stage is the voltage of the second control node Qb[N-1] of the previous stage.

For example, the tenth switching element M10 may be a P-type thin film transistor. The control electrode of the tenth switching element M10 may be a gate electrode, the input electrode of the tenth switching element M10 may be a source electrode and the output electrode of the tenth switching element M10 may be a drain electrode.

Referring to FIG. 8, the first clock signal CLK1 has an active level in first, third and fifth driving durations TM1, TM3 and TM5. The second clock signal CLK2 has an active level in second, fourth and sixth driving durations TM2, TM4 and TM6. In an embodiment, the first clock signal CLK1 only has the active level for part of each of the first, third and fifth driving durations TM1, TM3 and TM5. In an embodiment, the second clock signal CLK2 only has the active level for part of each of the second, fourth and sixth driving durations TM2, TM4 and TM6. In an exemplary embodiment, the durations at which the clock signals have the active level is the same. In an embodiment, the first and second clock signals CLK1 and CLK2 have a same frequency, but are out of phase with one another.

During the third driving duration TM3, the first switching element M1 is turned on in response to the first clock signal CLK1 and the scan signal SCAN[N-1] of the previous stage has the active level, and the voltage Q[N] of the first control node may have a first low level.

During the third driving duration TM3, the voltage Qb[N] of the second control node may have a low level due to the fourth switching element M4 and the fifth switching element M5.

During the fourth driving duration TM4, the voltage Q[N] of the first control node may be charge-boosted by the third switching element M3 and the first capacitor C1 so that the voltage Q[N] of the first control node may have a second low level.

During the fourth driving duration TM4, the seventh switching element M7 is turned on in response to the voltage Q[N] of the first control node and the first output node SCAN[N] outputs a pulse of the second clock signal CLK2 as the scan signal SCAN[N] of the present stage.

During the fifth driving duration TM5, the voltage Q[N] of the first control node increases back to a high level, and the scan signal SCAN[N] of the present stage also increases back to a high level.

The scan signal SCAN[N-1] of the previous stage has a waveform earlier than a waveform of the scan signal SCAN[N] of the present stage by a single driving duration. For example, the scan signal SCAN[N-1] of the previous stage may include a pulse that occurs before a pulse of the scan signal SCAN[N] of the present stage. The scan signal SCAN[N+1] of the next stage has a waveform later than a waveform of the scan signal SCAN[N] of the present stage by the single driving duration. For example, the scan signal SCAN[N+1] of the next stage may include a pulse that occurs after a pulse of the scan signal SCAN[N] of the present stage.

The voltage Qb[N] of the second control node may increase to a high level at an end portion of the third driving duration TM3 corresponding to the rising edge of the scan signal SCAN[N-1] of the previous stage.

The voltage Qb[N] of the second control node may maintain the high level during the fourth driving duration TM4. The voltage Qb[N] of the second control node decreases to a low level at a falling edge of the first clock signal CLK1 in the fifth driving duration TM5.

The voltage Qb[N-1] of the second control node of the previous stage has a waveform earlier than a waveform of the voltage Qb[N] of the second control node of the present stage by the single driving duration. For example, the voltage Qb[N-1] of the second control node of the previous stage may include a pulse that starts before a pulse of the voltage Qb[N] of the second control node of the present stage.

In the present exemplary embodiment of the inventive concept, the initialization signal VI is varied between the first initialization voltage VI(H) and the second initialization voltage VI(L) according to time. The initialization signal VI maintains the second initialization voltage VI(L) during the first driving duration TM1 and the second driving duration TM2.

The eighth switching element M8 is turned on and the initialization signal VI increases from the second initialization voltage VI(L) to the first initialization voltage VI(H) at the falling edge of the scan signal SCAN[N-1] of the previous stage in the third driving duration TM3.

The ninth switching element M9 is turned on and the initialization signal VI decreases from the first initialization voltage VI(H) to the second initialization voltage VI(L) at the falling edge of the second clock signal CLK2 in the fourth driving duration TM4.

In addition, the tenth switching element M10 is turned on and the initialization signal VI decreases from the first initialization voltage VI(H) to the second initialization voltage VI(L) at the falling edge of the voltage Qb[N-1] of the second control node of the previous stage in the fourth driving duration TM4.

Figure 9:
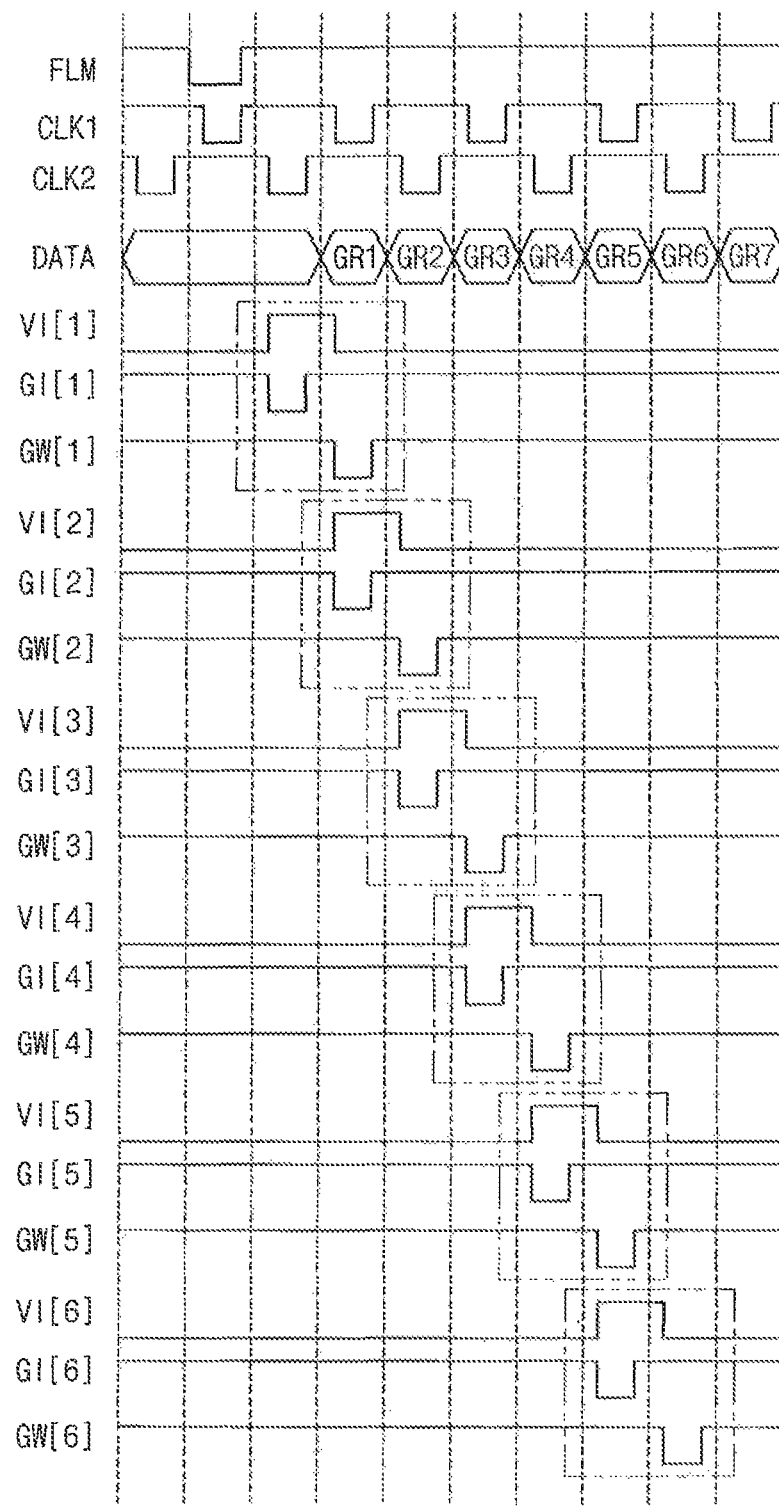
FIG. 9 is a timing diagram illustrating signals applied to the stages of the gate driver of FIG. 1.

FIG. 9 is a timing diagram illustrating signals applied to the stages of the gate driver 300 of FIG. 1.

Referring to FIGS. 1 to 9, a first data initialization gate signal GI[1] is applied to pixels in a first row through a first data initialization gate line of the display panel 100, a first data write gate signal GW[1] is applied to the pixels in the first row through a first data write gate line of the display panel 100 and a first initialization signal VI[1] is applied to the pixels in the first row through a first initialization line of the display panel 100.

In an embodiment, the first initialization signal VI[1] rises at a falling edge of the first data initialization gate signal GI[1] and falls at a falling edge of the first data write gate signal GW[1].

When the first data write gate signal GW[1] has an active level, data voltages corresponding to a first group GR1 of grayscale data may be outputted to the pixels in the first row of the display panel 100.

A second data initialization gate signal GI[2] is applied to pixels in a second row through a second data initialization gate line of the display panel 100, a second data write gate signal GW[2] is applied to the pixels in the second row through a second data write gate line of the display panel 100 and a second initialization signal VI[2] is applied to the pixels in the second row through a second initialization line of the display panel 100.

When the second data write gate signal GW[2] has an active level, data voltages corresponding to a second group GR2 of grayscale data may be outputted to the pixels in the second row of the display panel 100.

A third data initialization gate signal GI[3] is applied to pixels in a third row through a third data initialization gate line of the display panel 100, a third data write gate signal GW[3] is applied to the pixels in the third row through a third data write gate line of the display panel 100 and a third initialization signal VI[3] is applied to the pixels in the third row through a third initialization line of the display panel 100.

When the third data write gate signal GW[3] has an active level, data voltages corresponding to a third group GR3 of grayscale data may be outputted to the pixels in the third row of the display panel 100.

A fourth data initialization gate signal GI[4] is applied to pixels in a fourth row through a fourth data initialization gate line of the display panel 100, a fourth data write gate signal GW[4] is applied to the pixels in the fourth row through a fourth data write gate line of the display panel 100 and a fourth initialization signal VI[4] is applied to the pixels in the fourth row through a fourth initialization line of the display panel 100.

When the fourth data write gate signal GW[4] has an active level, data voltages corresponding to a fourth group GR4 of grayscale data may be outputted to the pixels in the fourth row of the display panel 100.

Figure 10:
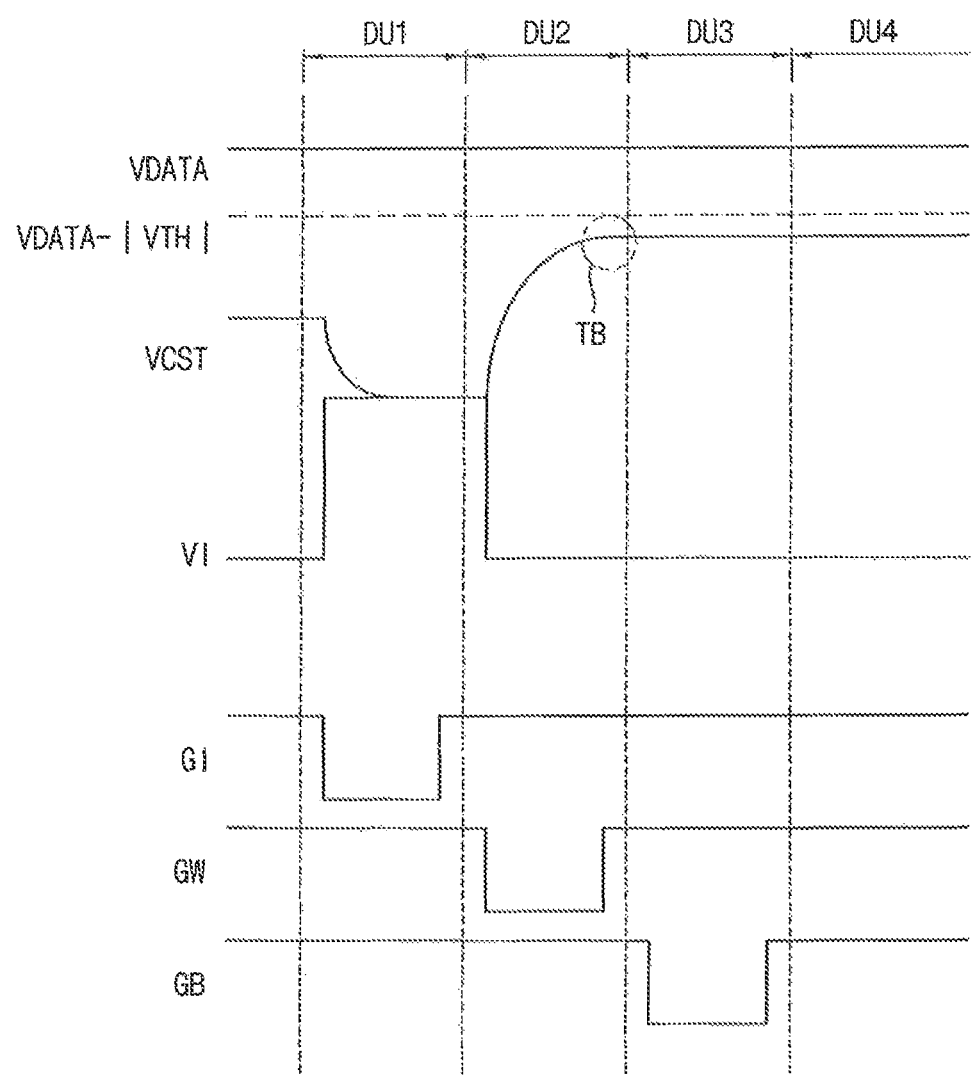
FIG. 10 is a timing diagram illustrating a varied initialization voltage of FIG. 8 and a level of a data voltage of a first pixel switching element of FIG. 2.

FIG. 10 is a timing diagram illustrating a varied initialization voltage of FIG. 8 and a level of a gate voltage of the first pixel switching element T1 of FIG. 2.

Referring to FIGS. 1 to 10, the data voltage VDATA has a uniform level for convenience of explanation. A voltage generated from subtracting the threshold voltage |VTH| of the first pixel switching element T1 from the data voltage VDATA may be applied to the first node N1 of the pixel.

The voltage which is generated from subtracting the threshold voltage |VTH| of the first pixel switching element T1 from the data voltage of the previous frame is maintained at the first node N1 prior to the first duration DU1. Since the voltage of the first node N1 is maintained by the storage capacitor CST, the voltage of the first node N1 may be referred to as a storage voltage VCST.

During the first duration DU1, the first node N1 and the storage capacitor CST are initialized by the data initialization gate signal GI.

During the first duration DU1, the initialization signal VI has a high level and the first node N1 and the storage capacitor CST are initialized by the high level of the initialization signal VI.

Thus, when the data voltage VDATA of which the threshold voltage |VTH| is compensated is written to the first node N1 during the second duration DU2, the charging rate of the voltage of the first node N1 may be increased (TB in FIG. 10) and the compensation of the threshold voltage |VTH| may be enhanced.

During the third duration DU3, the anode electrode of the organic light emitting diode OLED may be initialized by the organic light emitting diode initialization gate signal GB. During the third duration DU3, the initialization signal VI has a low level so that the anode electrode of the organic light emitting diode OLED is initialized by the low level of the initialization signal VI. Thus, the organic light emitting diode OLED is not turned on due to the leakage current so that the black display characteristics of the organic light emitting diode OLED may be enhanced.

According to the present exemplary embodiment, the initialization voltage VI is varied according to time so that the black image of the organic light emitting display apparatus is enhanced, the charging rate is increased and the compensation of the threshold voltage is enhanced.

Therefore, perception of a stain on the display panel 100 may be prevented so that the display quality of the display panel 100 is enhanced.

Figure 11:
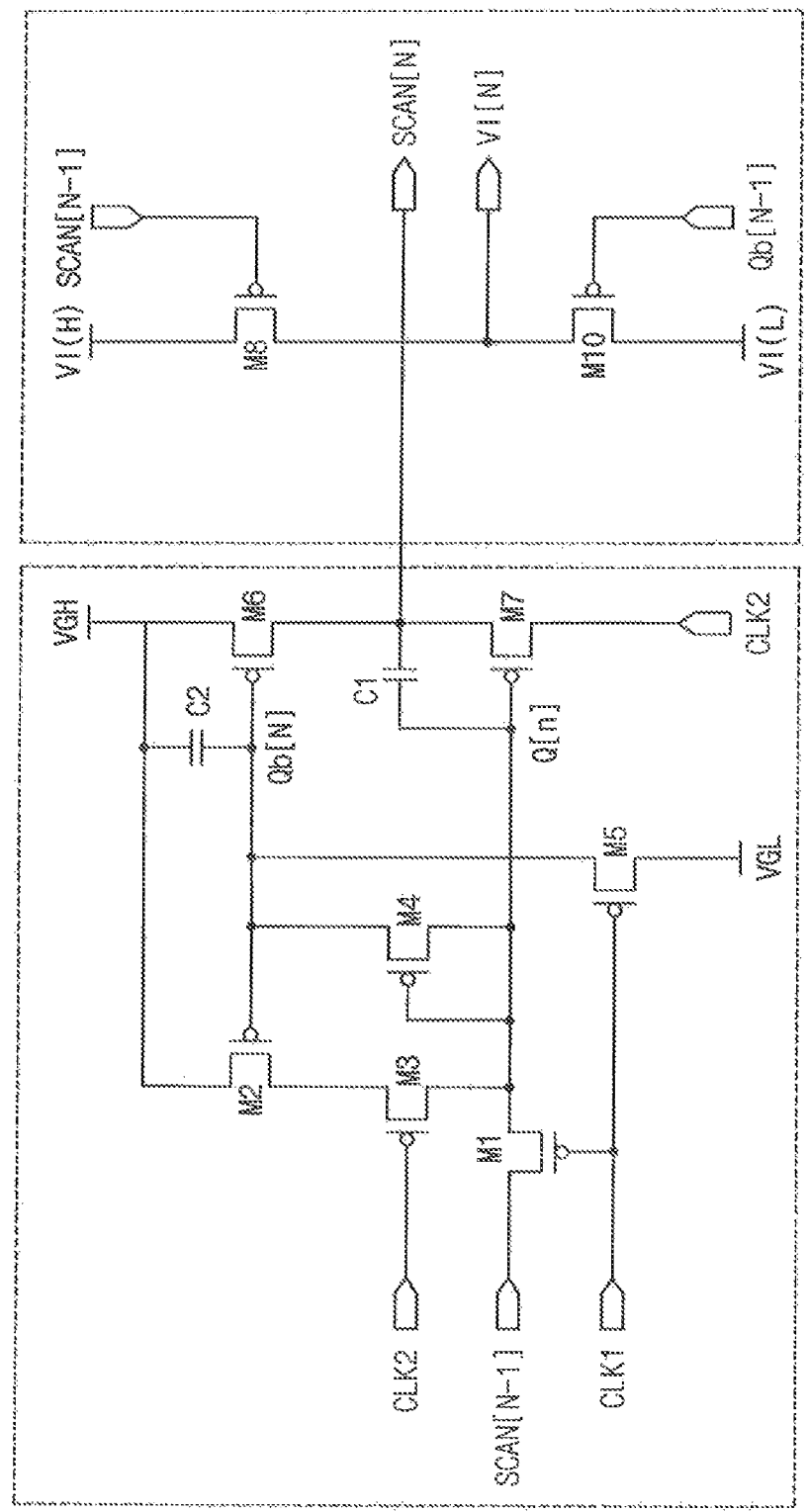
FIG. 11 is a circuit diagram illustrating a stage of a gate driver of a display apparatus according to an exemplary embodiment of the present inventive concept.

FIG. 11 is a circuit diagram illustrating a stage of a gate driver 300 of a display apparatus according to an exemplary embodiment of the present inventive concept.

The gate driver, the display apparatus and the method of driving the display panel according to the present exemplary embodiment is substantially the same as the gate driver, the display apparatus and the method of driving the display panel of the previous exemplary embodiment explained referring to FIGS. 1 to 10 except for the structure of the stage of the gate driver. Thus, the same reference numerals will be used to refer to the same or like parts as those described in the previous exemplary embodiment of FIGS. 1 to 10 and any repetitive explanation concerning the above elements will be omitted.

Referring to FIGS. 1 to 6 and 8 to 11, the display apparatus includes a display panel 100 and a display panel driver. The display panel driver includes a driving controller 200, a gate driver 300, a gamma reference voltage generator 400, a data driver 500 and an emission driver 600.

The gate driver 300 includes the plurality of stages (e.g. ST1 to ST4).

At least one of the stages ST1 to ST4 generates the scan signal SCAN[N] of the present stage and the initialization signal VI[N] of the present stage varied between a first initialization voltage VI(H) and a second initialization voltage VI(L) different from the first initialization voltage VI(H) according to time based on a clock signal (e.g. CLK1 and CLK2), a scan signal SCAN[N−1] of the previous stage, the first initialization voltage VI(H) and the second initialization voltage VI(L).

The present stage further receives a control signal (e.g. Qb[N−1]) of the previous stage.

At least one of the stages includes first to seven switching elements M1 to M7, a first capacitor C1 and a second capacitor C2.

The first switching element M1 includes a control electrode to which the first clock signal CLK1 is applied, an input electrode to which the scan signal SCAN[N−1] of the previous stage is applied and an output electrode connected to a first control node Q[N].

The second switching element M2 includes a control electrode connected to a second control node Qb[N], an input electrode to which a first gate power voltage VGH is applied and an output electrode connected to an input electrode of the third switching element M3.

The third switching element M3 includes a control electrode to which the second clock signal CLK2 is applied, an input electrode connected to the output electrode of the second switching element M2 and an output electrode connected to the first control node Q[N].

The fourth switching element M4 includes a control electrode connected to the first control node Q[N], an input electrode connected to the second control node Qb[N] and an output electrode connected to the first control node Q[N].

The fifth switching element M5 includes a control electrode to which the first clock signal CLK1 is applied, an input electrode to which a second gate power voltage VGL different from the first gate power voltage VGH is applied and an output electrode connected to the second control node Qb[N].

The sixth switching element M6 includes a control electrode connected to the second control node Qb[N], an input electrode to which the first gate power voltage VGH is applied and an output electrode connected to a first output node SCAN[N]. The first output node SCAN[N] may be a node outputting the scan signal of the present stage.

The seventh switching element M7 includes a control electrode connected to the first control node Q[N], an input electrode to which the second clock signal CLK2 is applied and an output electrode connected to the first output node SCAN[N].

The first capacitor C1 includes a first electrode connected to the first output node SCAN[N] and a second electrode connected to the first control node Q[N].

The second capacitor C2 includes a first electrode to which the first gate power voltage VGH is applied and a second electrode connected to the second control node Qb[N].

In the present exemplary embodiment, at least one of the stages further includes an eighth switching element M8 and a tenth switching element M10.

The eighth switching element M8 includes a control electrode to which the scan signal SCAN[N−1] of the previous stage is applied, an input electrode to which the first initialization voltage VI(H) is applied and an output electrode connected to a second output node VI[N]. The second output node VI[N] may be a node outputting the initialization signal VI of the present stage.

The tenth switching element M10 includes a control electrode to which the control signal Qb[N−1] of the previous stage is applied, an input electrode to which the second initialization voltage VI(L) is applied and an output electrode connected to the second output node VI[N].

Herein, the control signal of the previous stage may be the voltage of the second control node Qb[N−1] of the previous stage.

In the present exemplary embodiment, the initialization signal VI is varied between the first initialization voltage VI(H) and the second initialization voltage VI(L) according to time. The initialization signal VI maintains the second initialization voltage VI(L) during the first driving duration TM1 and the second driving duration TM2 of FIG. 8.

The eighth switching element M8 is turned on and the initialization signal VI increases from the second initialization voltage VI(L) to the first initialization voltage VI(H) at the falling edge of the scan signal SCAN[N−1] of the previous stage in the third driving duration TM3 of FIG. 8.

The tenth switching element M10 is turned on and the initialization signal VI decreases from the first initialization voltage VI(H) to the second initialization voltage VI(L) at the falling edge of the voltage Qb[N−1] of the second control node of the previous stage in the fourth driving duration TM4 of FIG. 8.

According to the present exemplary embodiment, the initialization voltage VI is varied according to time so that a black image of the organic light emitting display apparatus is enhanced, a charging rate is increased and the compensation of the threshold voltage is enhanced.

Therefore, perception of a stain on the display panel 100 may be prevented so that the display quality of the display panel 100 is enhanced.

Figure 12:
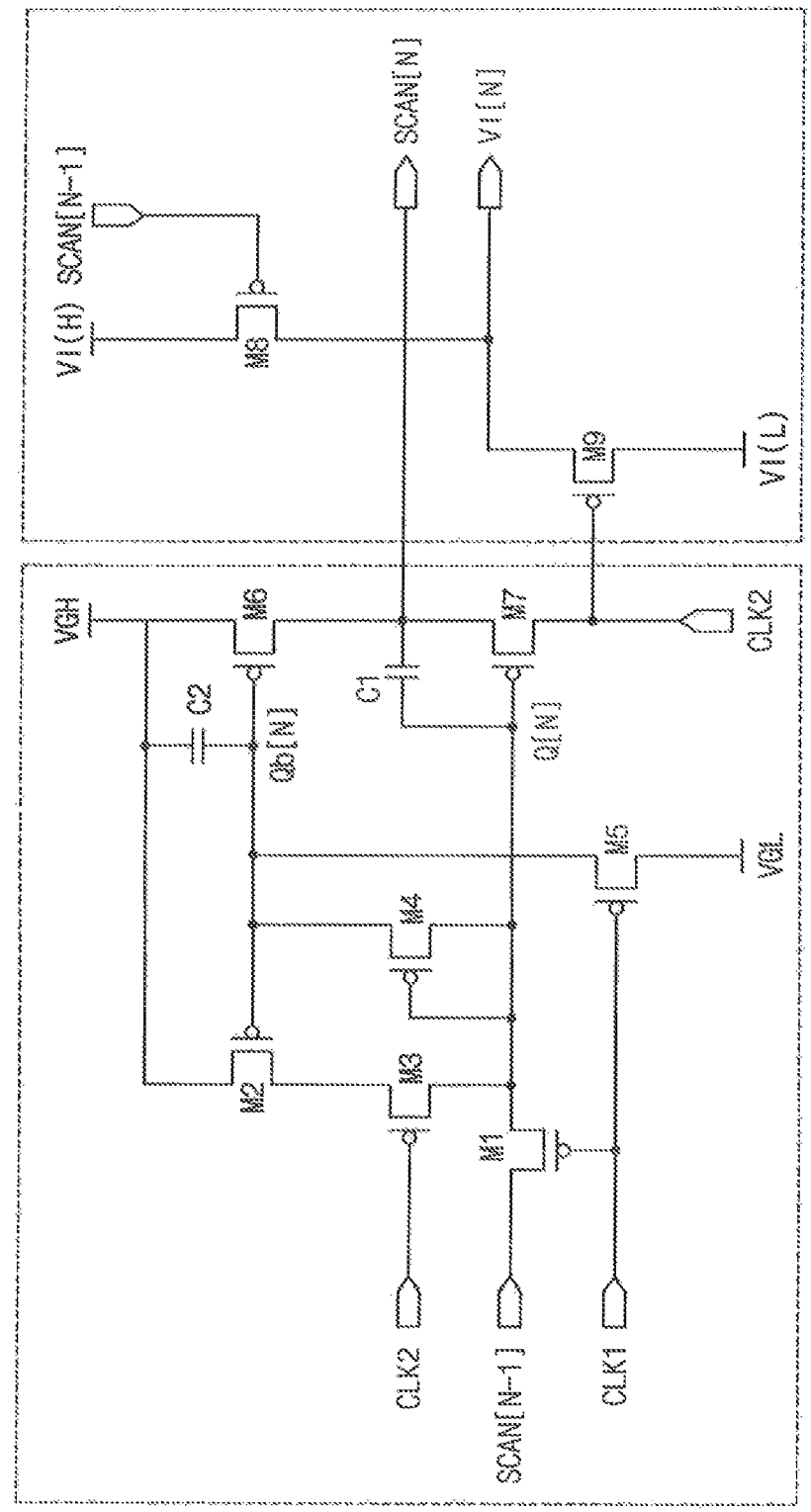
FIG. 12 is a circuit diagram illustrating a stage of a gate driver of a display apparatus according to an exemplary embodiment of the present inventive concept.

FIG. 12 is a circuit diagram illustrating a stage of a gate driver of a display apparatus according to an exemplary embodiment of the present inventive concept.

The gate driver, the display apparatus and the method of driving the display panel according to the present exemplary embodiment is substantially the same as the gate driver, the display apparatus and the method of driving the display panel of the previous exemplary embodiment explained referring to FIGS. 1 to 10 except for the structure of the stage of the gate driver. Thus, the same reference numerals will be used to refer to the same or like parts as those described in the previous exemplary embodiment of FIGS. 1 to 10 and any repetitive explanation concerning the above elements will be omitted.

Referring to FIGS. 1 to 6, 8 to 10 and 12, the display apparatus includes a display panel 100 and a display panel driver. The display panel driver includes a driving controller 200, a gate driver 300, a gamma reference voltage generator 400, a data driver 500 and an emission driver 600.

The gate driver 300 includes the plurality of stages (e.g. ST1 to ST4).

At least one of the stages ST1 to ST4 generates the scan signal SCAN[N] of the present stage and the initialization signal VI[N] of the present stage varied between a first initialization voltage VI(H) and a second initialization voltage VI(L) different from the first initialization voltage VI(H) according to time based on a clock signal (e.g. CLK1 and CLK2), a scan signal SCAN[N−1] of the previous stage, the first initialization voltage VI(H) and the second initialization voltage VI(L).

At least one of the stages includes first to seven switching elements M1 to M7, a first capacitor C1 and a second capacitor C2.

The first switching element M1 includes a control electrode to which the first clock signal CLK1 is applied, an input electrode to which the scan signal SCAN[N−1] of the previous stage is applied and an output electrode connected to a first control node Q[N].

The second switching element M2 includes a control electrode connected to a second control node Qb[N], an input electrode to which a first gate power voltage VGH is applied and an output electrode connected to an input electrode of the third switching element M3.

The third switching element M3 includes a control electrode to which the second clock signal CLK2 is applied, the input electrode connected to the output electrode of the second switching element M2 and an output electrode connected to the first control node Q[N].

The fourth switching element M4 includes a control electrode connected to the first control node Q[N], an input electrode connected to the second control node Qb[N] and an output electrode connected to the first control node Q[N].

The fifth switching element M5 includes a control electrode to which the first clock signal CLK1 is applied, an input electrode to which a second gate power voltage VGL different from the first gate power voltage VGH is applied and an output electrode connected to the second control node Qb[N].

The sixth switching element M6 includes a control electrode connected to the second control node Qb[N], an input electrode to which the first gate power voltage VGH is applied and an output electrode connected to a first output node SCAN[N]. The first output node SCAN[N] may be a node outputting the scan signal of the present stage.

The seventh switching element M7 includes a control electrode connected to the first control node Q[N], an input electrode to which the second clock signal CLK2 is applied and an output electrode connected to the first output node SCAN[N].

The first capacitor C1 includes a first electrode connected to the first output node SCAN[N] and a second electrode connected to the first control node Q[N].

The second capacitor C2 includes a first electrode to which the first gate power voltage VGH is applied and a second electrode connected to the second control node Qb[N].

In the present exemplary embodiment, at least one of the stages further includes an eighth switching element M8 and a ninth switching element M9.

The eighth switching element M8 includes a control electrode to which the scan signal SCAN[N−1] of the previous stage is applied, an input electrode to which the first initialization voltage VI(H) is applied and an output electrode connected to a second output node VI[N]. The second output node VI[N] may be a node outputting the initialization signal VI of the present stage.

The ninth switching element M9 includes a control electrode to which the second clock signal CLK2 is applied, an input electrode to which the second initialization voltage VI(L) is applied and an output electrode connected to the second output node VI[N].

In the present exemplary embodiment, the initialization signal VI is varied between the first initialization voltage VI(H) and the second initialization voltage VI(L) according to time. The initialization signal VI maintains the second initialization voltage VI(L) during the first driving duration TM1 and the second driving duration TM2 of FIG. 8.

The eighth switching element M8 is turned on and the initialization signal VI increases from the second initialization voltage VI(L) to the first initialization voltage VI(H) at the falling edge of the scan signal SCAN[N−1] of the previous stage in the third driving duration TM3 of FIG. 8.

The ninth switching element M9 is turned on and the initialization signal VI decreases from the first initialization voltage VI(H) to the second initialization voltage VI(L) at the falling edge of the second clock signal CLK2 in the fourth driving duration TM4 of FIG. 8.

According to the present exemplary embodiment, the initialization voltage VI is varied according to time so that the black image of the organic light emitting display apparatus is enhanced, the charging rate is increased and the compensation of the threshold voltage is enhanced.

Therefore, perception of a stain on the display panel 100 may be prevented so that the display quality of the display panel 100 is enhanced.

Figure 13:
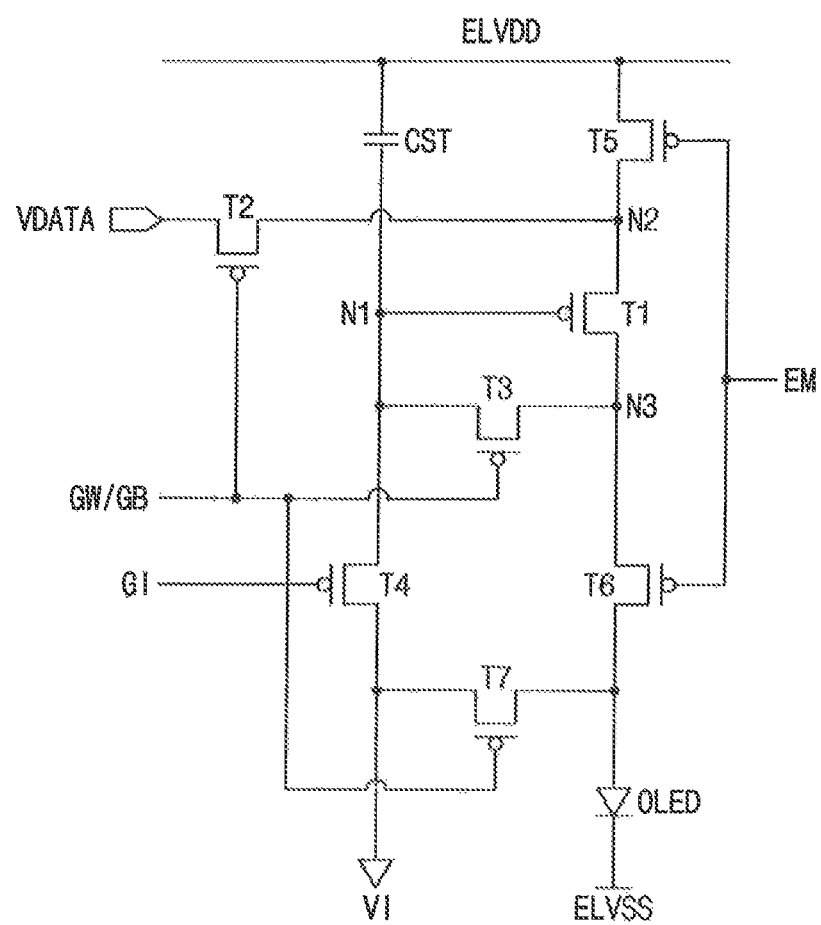
FIG. 13 is a circuit diagram illustrating a pixel of a display panel of a display apparatus according to an exemplary embodiment of the present inventive concept.
Figure 14:
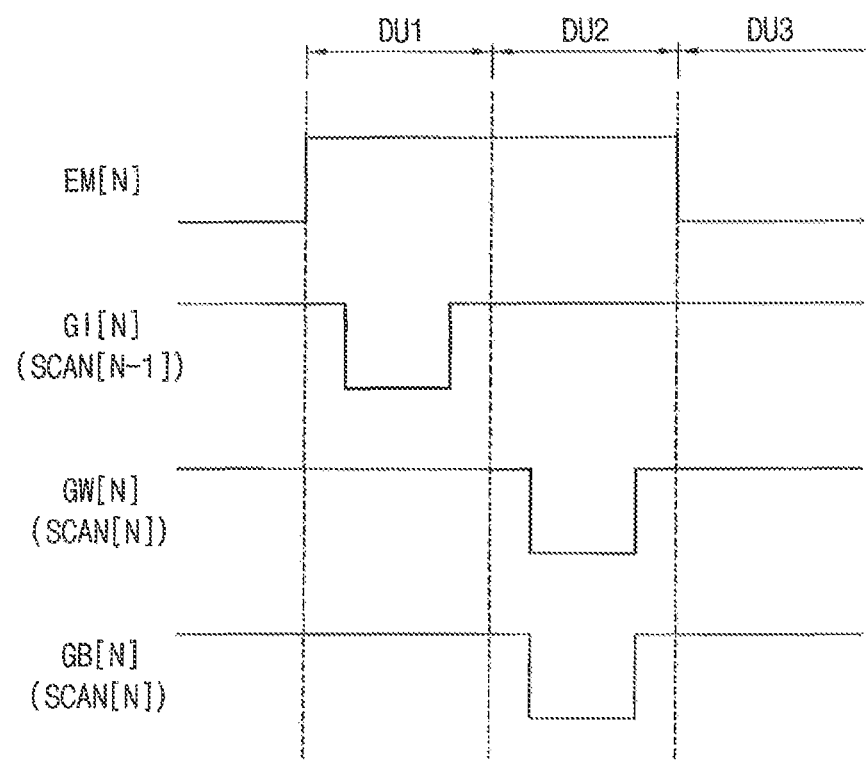
FIG. 14 is a timing diagram illustrating input signals applied to the pixel of FIG. 13.

FIG. 13 is a circuit diagram illustrating a pixel of a display panel 100 of a display apparatus according to an exemplary embodiment of the present inventive concept. FIG. 14 is a timing diagram illustrating input signals applied to the pixel of FIG. 13.

The gate driver, the display apparatus and the method of driving the display panel according to the present exemplary embodiment is substantially the same as the gate driver, the display apparatus and the method of driving the display panel of the previous exemplary embodiment explained referring to FIGS. 1 to 10 except for the timing of initialization of the organic light emitting diode. Thus, the same reference numerals will be used to refer to the same or like parts as those described in the previous exemplary embodiment of FIGS. 1 to 10 and any repetitive explanation concerning the above elements will be omitted.

Referring to FIGS. 1, 13 and 14, the display apparatus includes a display panel 100 and a display panel driver. The display panel driver includes a driving controller 200, a gate driver 300, a gamma reference voltage generator 400, a data driver 500 and an emission driver 600.

The display panel 100 includes the plurality of the pixels. Each pixel includes an organic light emitting diode OLED.

The pixels receive a data write gate signal GW, a data initialization gate signal GI, an organic light emitting diode initialization signal GB, the data voltage VDATA and the emission signal EM and the organic light emitting diodes OLED of the pixels emit light corresponding to the level of the data voltage VDATA to display the image.

At least one of the pixels includes first to seventh pixel switching elements T1 to T7, a storage capacitor CST and the organic light emitting diode OLED.

The first pixel switching element T1 includes a control electrode connected to a first node N1, an input electrode connected to a second node N2 and an output electrode connected to a third node N3.

The second pixel switching element T2 includes a control electrode to which the data write gate signal GW is applied, an input electrode to which the data voltage VDATA is applied and an output electrode connected to the second node N2.

The third pixel switching element T3 includes a control electrode to which the data write gate signal GW is applied, an input electrode connected to the first node N1 and an output electrode connected to the third node N3.

The fourth pixel switching element T4 includes a control electrode to which the data initialization gate signal GI is applied, an input electrode to which the initialization signal VI is applied and an output electrode connected to the first node N1.

The fifth pixel switching element T5 includes a control electrode to which the emission signal EM is applied, an input electrode to which a high power voltage ELVDD is applied and an output electrode connected to the second node N2.

The sixth pixel switching element T6 includes a control electrode to which the emission signal EM is applied, an input electrode connected to the third node N3 and an output electrode connected to an anode electrode of the organic light emitting diode OLED.

The seventh pixel switching element T7 includes a control electrode to which the organic light emitting diode initialization gate signal GB is applied, an input electrode to which the initialization signal VI is applied and an output electrode connected to the anode electrode of the organic light emitting diode OLED.

In the present exemplary embodiment, the organic light emitting diode initialization gate signal GB is the same as the data write gate signal GW. For example, the control electrode of the seventh pixel switching element T7 may be connected to the control electrode of the second pixel switching element T2.

The storage capacitor CST includes a first electrode to which the high power voltage ELVDD is applied and a second electrode connected to the first node N1.

In FIG. 14, during a first duration DU1, the first node N1 and the storage capacitor CST are initialized in response to the data initialization gate signal GI. During a second duration DU2, a threshold voltage |VTH| of the first pixel switching element T1 is compensated and the data voltage VDATA of which the threshold voltage |VTH| is compensated is written to the first node N1 in response to the data write gate signal GW/GB. In addition, during the second duration DU2, the anode electrode of the organic light emitting diode OLED is initialized in response to the organic light emitting diode initialization gate signal GW/GB. During a third duration DU3, the organic light emitting diode OLED emits light in response to the emission signal EM so that the display panel 100 displays the image.

Figure 15:
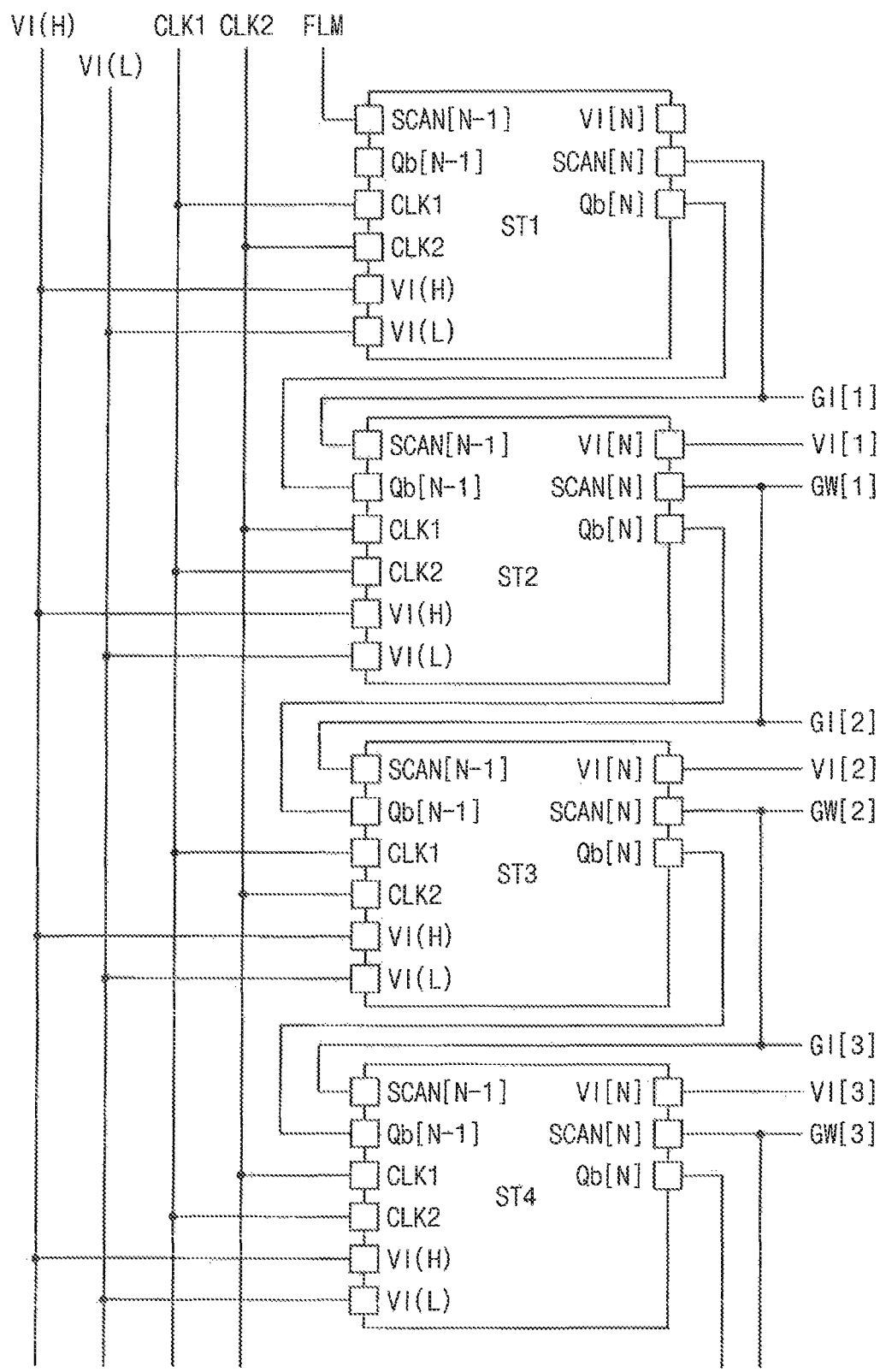
FIG. 15 is a block diagram illustrating a plurality of stages of a gate driver of the display apparatus of FIG. 13.

FIG. 15 is a block diagram illustrating a plurality of stages of the gate driver 300 of the display apparatus of FIG. 13 according to an exemplary embodiment of the inventive concept.

Referring to FIGS. 1 and 13 to 15, the gate driver 300 includes the plurality of stages (e.g. ST1 to ST4).

At least one of the stages ST1 to ST4 generates the scan signal SCAN[N] of the present stage and the initialization signal VI[N] of the present stage varied between a first initialization voltage VI(H) and a second initialization voltage VI(L) different from the first initialization voltage VI(H) according to time based on a clock signal (e.g. CLK1 and CLK2), a scan signal SCAN[N−1] of the previous stage, the first initialization voltage VI(H) and the second initialization voltage VI(L).

In an embodiment, a first stage ST1 receives a vertical start signal FLM instead of the scan signal of the previous stage.

In an embodiment, the present stage further receives a control signal (e.g. Qb[N−1]) of the previous stage.

The scan signal of the first stage ST1 may be the data initialization gate signal GI[1] of the second stage ST2 and the scan signal of the second stage ST2 may be the data write gate signal GW[1] of the second stage ST2.

The scan signal of the second stage ST2 may be the data initialization gate signal GI[2] of the third stage ST3 and the scan signal of the third stage ST3 may be the data write gate signal GW[2] of the third stage ST3.

Figure 16:
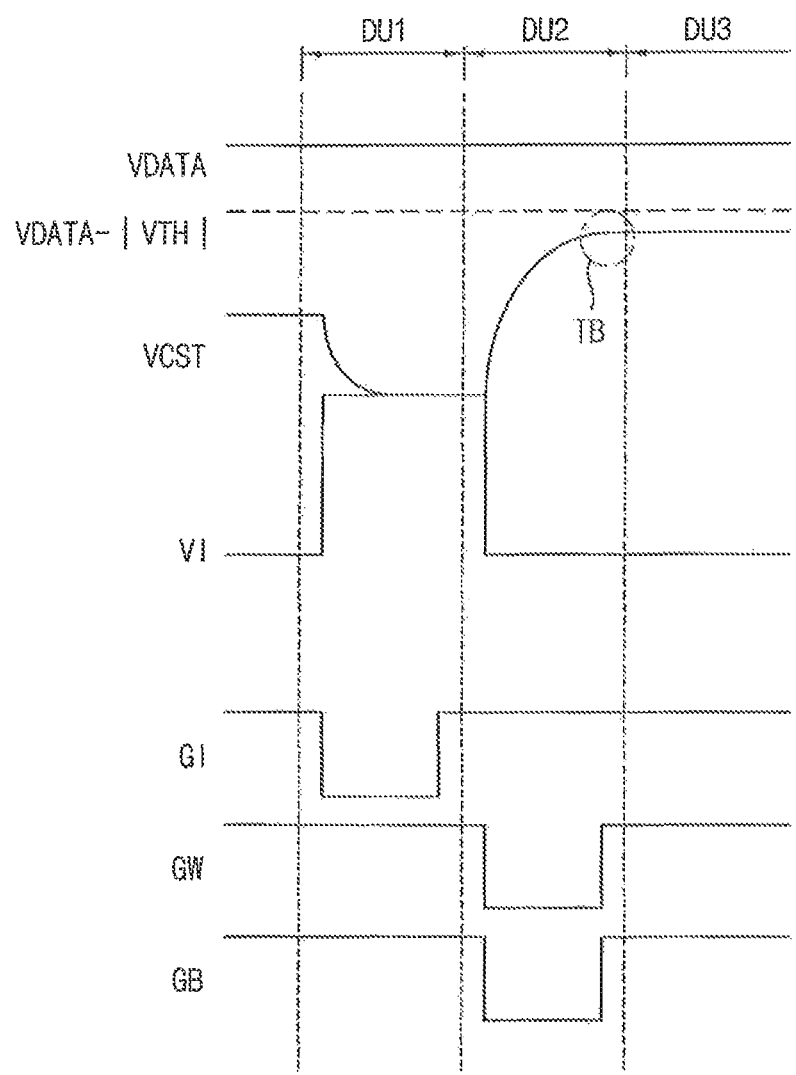
FIG. 16 is a timing diagram illustrating a varied initialization voltage of the display apparatus of FIG. 13 and a level of a data voltage of a first pixel switching element of FIG. 13.

FIG. 16 is a timing diagram illustrating a varied initialization voltage of the display apparatus of FIG. 13 and a level of a data voltage of the first pixel switching element T1 of FIG. 13.

Referring to FIGS. 1 and 13 to 16, the data voltage VDATA has a uniform level for convenience of explanation. A voltage generated from subtracting the threshold voltage |VTH| of the first pixel switching element T1 from the data voltage VDATA may be applied to the first node N1 of the pixel.

The voltage generated from subtracting the threshold voltage |VTH| of the first pixel switching element T1 from the data voltage of the previous frame is maintained at the first node N1 prior to the first duration DU1. Since the voltage of the first node N1 is maintained by the storage capacitor CST, the voltage of the first node N1 may be referred to as a storage voltage VCST.

During the first duration DU1, the first node N1 and the storage capacitor CST are initialized by the data initialization gate signal GI.

During the first duration DU1, the initialization signal VI has a high level and the first node N1 and the storage capacitor CST are initialized by the high level of the initialization signal VI.

Thus, when the data voltage VDATA of which the threshold voltage |VTH| is compensated is written to the first node N1 during the second duration DU2, the charging rate of the voltage of the first node N1 may be increased (TB in FIG. 16) and the compensation of the threshold voltage |VTH| may be enhanced.

During the second duration DU2, the anode electrode of the organic light emitting diode OLED may be initialized by the organic light emitting diode initialization gate signal GW/GB. During the second duration DU2, the initialization signal VI has a low level so that the anode electrode of the organic light emitting diode OLED is initialized by the low level of the initialization signal VI. Thus, the organic light emitting diode OLED is not turned on due to the leakage current so that a black display characteristics of the organic light emitting diode OLED is enhanced.

According to the present exemplary embodiment, the initialization voltage VI is varied according to time so that a black image of the organic light emitting display apparatus may be enhanced, the charging rate may be increased and the compensation of the threshold voltage may be enhanced.

Therefore, perception of a stain on the display panel 100 may be prevented so that the display quality of the display panel 100 is enhanced.

According to at least one embodiment of the present inventive concept as explained above, the initialization voltage is varied so that the display quality of the organic light emitting display panel may be enhanced.

Although a few exemplary embodiments of the present inventive concept have been described, those skilled in the art will readily appreciate that many modifications are possible in the exemplary embodiments without materially departing from the present inventive concept. Accordingly, all such modifications are intended to be included within the scope of the present inventive concept. Therefore, it is to be understood that the foregoing is illustrative of the present inventive concept and is not to be construed as limited to the specific exemplary embodiments disclosed, and that modifications to the disclosed exemplary embodiments, as well as other exemplary embodiments, are intended to be included within the scope of the inventive concept.

What is claimed is:

1. A gate driver comprising:
 a plurality of stages,
 wherein a present stage among the plurality of stages is configured to receive a clock signal, a scan signal of a previous stage among the plurality of stages that is before the present stage, a first initialization voltage and a second initialization voltage different from the first initialization voltage and to generate a scan signal of the present stage and an initialization signal of the present stage based on the clock signal, the scan signal of the previous stage, the first initialization voltage and the second initialization voltage, and
 wherein the initialization signal of the present stage is varied between the first initialization voltage and the second initialization voltage according to time.

2. The gate driver of claim 1, wherein the initialization signal has the first initialization voltage when the scan signal of the previous stage has an active level, and
 wherein the initialization signal has the second initialization voltage when the scan signal of the present stage has the active level.

3. The gate driver of claim 2, wherein the present stage comprises:
 a first switching element including a control electrode to which a first clock signal is applied, an input electrode to which the scan signal of the previous stage is applied and an output electrode connected to a first control node;
 a second switching element including a control electrode connected to a second control node, an input electrode to which a first gate power voltage is applied and an output electrode connected to an input electrode of a third switching element;
 the third switching element including a control electrode to which a second clock signal is applied, an input electrode connected to the output electrode of the second switching element and an output electrode connected to the first control node;
a fourth switching element including a control electrode connected to the first control node, an input electrode connected to the second control node and an output electrode connected to the first control node;
a fifth switching element including a control electrode to which the first clock signal is applied, an input electrode to which a second gate power voltage different from the first gate power voltage is applied and an output electrode connected to the second control node;
a sixth switching element including a control electrode connected to the second control node, an input electrode to which the first gate power voltage is applied and an output electrode connected to a first output node; and
a seventh switching element including a control electrode connected to the first control node, an input electrode to which the second clock signal is applied and an output electrode connected to the first output node.

4. The gate driver of claim 3, wherein the present stage is configured to receive a control signal of the previous stage, the previous stage includes the same switching elements as the present stage and
wherein the control signal of the previous stage is received from the second control node of the previous stage.

5. The gate driver of claim 3, wherein the present stage further comprises:
an eighth switching element including a control electrode to which the scan signal of the previous stage is applied, an input electrode to which the first initialization voltage is applied and an output electrode connected to a second output node;
a ninth switching element including a control electrode to which the second clock signal is applied, an input electrode to which the second initialization voltage is applied and an output electrode connected to the second output node; and
a tenth switching element including a control electrode to which a control signal of the previous stage is applied, an input electrode to which the second initialization voltage is applied and an output electrode connected to the second output node.

6. The gate driver of claim 3, wherein the present stage further comprises:
an eighth switching element including a control electrode to which the scan signal of the previous stage is applied, an input electrode to which the first initialization voltage is applied and an output electrode connected to a second output node; and
a ninth switching element including a control electrode to which a control signal of the previous stage is applied, an input electrode to which the second initialization voltage is applied and an output electrode connected to the second output node.

7. The gate driver of claim 3, wherein the present stage further comprises:
an eighth switching element including a control electrode to which the scan signal of the previous stage is applied, an input electrode to which the first initialization voltage is applied and an output electrode connected to a second output node; and
a ninth switching element including a control electrode to which the second clock signal is applied, an input electrode to which the second initialization voltage is applied and an output electrode connected to the second output node.

8. The gate driver of claim 1, wherein the second initialization voltage is equal to or less than a sum of a low power voltage applied to a cathode electrode of an organic light emitting diode of a pixel and a threshold voltage of the organic light emitting diode.

9. The gate driver of claim 8, wherein the second initialization voltage is equal to the low power voltage.

10. A display apparatus comprising:
a display panel configured to display an image;
a gate driver comprising a plurality of stages, wherein a present stage among the plurality of stages is configured to receive a clock signal, a scan signal of a previous stage of the plurality of stages that is before the present stage, a first initialization voltage and a second initialization voltage different from the first initialization voltage and to generate a scan signal of the present stage and an initialization signal of the present stage based on the clock signal, the scan signal of the previous stage, the first initialization voltage and the second initialization voltage, the gate driver configured to output the scan signal of the present stage and the initialization signal of the present stage to the display panel;
a data driver configured to output a data voltage to the display panel; and
an emission driver configured to output an emission signal to the display panel,
wherein the initialization signal of the present stage is varied between the first initialization voltage and the second initialization voltage according to time.

11. The display apparatus of claim 10, wherein the initialization signal has the first initialization voltage when the scan signal of the previous stage has an active level, and
wherein the initialization signal has the second initialization voltage when the scan signal of the present stage has the active level.

12. The display apparatus of claim 11, wherein the display panel comprises a plurality of pixels, each of the pixels comprises an organic light emitting diode, and
wherein the pixels are configured to receive a data write gate signal, a data initialization gate signal, an organic light emitting diode initialization gate signal, the data voltage and the emission signal and to emit light using the organic light emitting diode according to a level of the data voltage.

13. The display apparatus of claim 12, wherein at least one of the pixels comprises:
a first pixel switching element including a control electrode connected to a first node, an input electrode connected to a second node and an output electrode connected to a third node;
a second pixel switching element including a control electrode to which the data write gate signal is applied, an input electrode to which the data voltage is applied and an output electrode connected to the second node;
a third pixel switching element including a control electrode to which the data write gate signal is applied, an input electrode connected to the first node and an output electrode connected to the third node;
a fourth pixel switching element including a control electrode to which the data initialization gate signal is applied, an input electrode to which the initialization signal of the present stage is applied and an output electrode connected to the first node;

a fifth pixel switching element including a control electrode to which the emission signal is applied, an input electrode to which a high power voltage is applied and an output electrode connected to the second node;

a sixth pixel switching element including a control electrode to which the emission signal is applied, an input electrode connected to the third node and an output electrode connected to an anode electrode of the organic light emitting diode;

a seventh pixel switching element including a control electrode to which the organic light emitting diode initialization gate signal is applied, an input electrode to which the initialization signal of the present stage is applied and an output electrode connected to the anode electrode of the organic light emitting diode;

a storage capacitor including a first electrode to which the high power voltage is applied and a second electrode connected to the first node; and the organic light emitting diode including the anode electrode and a cathode electrode to which a low power voltage is applied.

14. The display apparatus of claim 12, wherein the data initialization gate signal of the present stage is the scan signal of the previous stage, wherein the data write gate signal of the present stage is the scan signal of the present stage, and wherein the organic light emitting diode initialization gate signal of the present stage is a scan signal of a next stage among the plurality stages that is after the present stage.

15. The display apparatus of claim 12, wherein the data initialization gate signal of the present stage is the scan signal of the previous stage, wherein the data write gate signal of the present stage is the scan signal of the present stage, and wherein the organic light emitting diode initialization gate signal of the present stage is the scan signal of the present stage.

16. A method of driving a display panel, the method comprises:

outputting a scan signal of a present stage among a plurality of stages of a gate driver and an initialization signal of the present stage to the display panel based on a clock signal, a scan signal of a previous stage of the plurality of stages that is before the present stage, a first initialization voltage and a second initialization voltage different from the first initialization voltage;

outputting a data voltage to the display panel; and outputting an emission signal to the display panel, wherein the initialization signal of the present stage is varied between the first initialization voltage and the second initialization voltage according to time.

17. The method of claim 16, wherein the initialization signal has the first initialization voltage when the scan signal of the previous stage has an active level, and wherein the initialization signal has the second initialization voltage when the scan signal of the present stage has an active level.

18. The method of claim 17, wherein the display panel comprises a plurality of pixels, each of the pixels comprises an organic light emitting diode, and wherein the pixels are configured to receive a data write gate signal, a data initialization gate signal, an organic light emitting diode initialization gate signal, the data voltage and the emission signal and to emit light using the organic light emitting diode according to a level of the data voltage.

19. The method of claim 18, wherein the data initialization gate signal of the present stage is the scan signal of the previous stage, wherein the data write gate signal of the present stage is the scan signal of the present stage, and wherein the organic light emitting diode initialization gate signal of the present stage is a scan signal of a next stage of the plurality of stages that is after the present stage.

20. The method of claim 18, wherein the data initialization gate signal of the present stage is the scan signal of the previous stage, wherein the data write gate signal of the present stage is the scan signal of the present stage, and wherein the organic light emitting diode initialization gate signal of the present stage is the scan signal of the present stage.

* * * * *